(12) United States Patent
Ozevin

(10) Patent No.: US 12,407,974 B2
(45) Date of Patent: Sep. 2, 2025

(54) MULTI FREQUENCY ACOUSTIC EMISSION MICROMACHINED TRANSDUCERS FOR NON-DESTRUCTIVE EVALUATION OF STRUCTURAL HEALTH

(71) Applicant: The Board of Trustees of the University of Illinois, Urbana, IL (US)

(72) Inventor: Didem Ozevin, Chicago, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 517 days.

(21) Appl. No.: 17/628,999

(22) PCT Filed: Jul. 23, 2020

(86) PCT No.: PCT/US2020/043282
§ 371 (c)(1),
(2) Date: Jan. 21, 2022

(87) PCT Pub. No.: WO2021/016458
PCT Pub. Date: Jan. 28, 2021

(65) Prior Publication Data
US 2022/0326188 A1 Oct. 13, 2022

Related U.S. Application Data

(60) Provisional application No. 62/877,593, filed on Jul. 23, 2019.

(51) Int. Cl.
*H04R 1/24* (2006.01)
*B81B 3/00* (2006.01)
(Continued)

(52) U.S. Cl.
CPC ............ *H04R 1/24* (2013.01); *B81B 3/0021* (2013.01); *B81B 7/0032* (2013.01); *G01N 29/14* (2013.01);
(Continued)

(58) Field of Classification Search
CPC .. H04R 1/24; H04R 2201/003; B81B 3/0021; B81B 7/0032; B81B 2201/0271;
(Continued)

(56) References Cited

U.S. PATENT DOCUMENTS 8,531,088 B2 9/2013 Grosh et al.
9,084,045 B2 7/2015 Scholte
(Continued)

FOREIGN PATENT DOCUMENTS

KR 20190141721 A * 12/2019 ............ H04R 19/02
WO WO-2008125071 A1 * 10/2008 ............ G01H 13/00

OTHER PUBLICATIONS

Translation KR-2019014721-A (Year: 2019).*
(Continued)

*Primary Examiner* — Helen C Kwok
(74) *Attorney, Agent, or Firm* — Thomas | Horstemeyer, LLP

(57) ABSTRACT

A MEMS AE transducer system is provided that takes advantage of the low power consumption and lightweight characteristics of MEMS AE transducers, while also achieving higher sensing sensitivity. To address the problem of low sensitivity typically associated with MEMS AE transducers, electrical responses of multiple MEMS AE transducers operating at different frequency ranges are combined to increase the bandwidth and sensitivity of the MEMS AE transducer system. As the frequencies are constructive, the combined response on a single channel is the actual summation of two signals with an improved signal to noise ratio.

(Continued)

Additionally, each frequency can be decomposed because they are well separated from each other due to the super narrowband response and high Quality factor of MEMS AE transducers.

20 Claims, 19 Drawing Sheets

(51) Int. Cl.
  *B81B 7/00* (2006.01)
  *G01N 29/14* (2006.01)
(52) U.S. Cl.
  CPC ............ *B81B 2201/0271* (2013.01); *B81B 2203/0118* (2013.01); *B81B 2203/0127* (2013.01); *B81B 2203/04* (2013.01); *B81B 2207/01* (2013.01); *H04R 2201/003* (2013.01)
(58) Field of Classification Search
  CPC ..... B81B 2203/0118; B81B 2203/0127; B81B 2203/04; B81B 2207/01
  USPC .......................................................... 73/587
  See application file for complete search history.

(56) References Cited

U.S. PATENT DOCUMENTS

2017/0094433 A1  3/2017  McCarty et al.
2017/0368574 A1  12/2017  Sammoura et al.

OTHER PUBLICATIONS

Translation WO-2008125071-A1 (Year: 2008).*
Ozevin, D., "Resonant capacitive MEMS acoustic emission transducers", IOP Science Smart Materials and Structures, vol. 15, No. 6, Nov. 2, 2006.
Kabin, et al., "Piezoelectric MEMS acoustic emission sensors", Sensors and Actuators A: Physical, (2018), 53-64.
International Search Report, Written Opinion, and Search History for PCT/US20/43282, mailed Oct. 5, 2020.

* cited by examiner

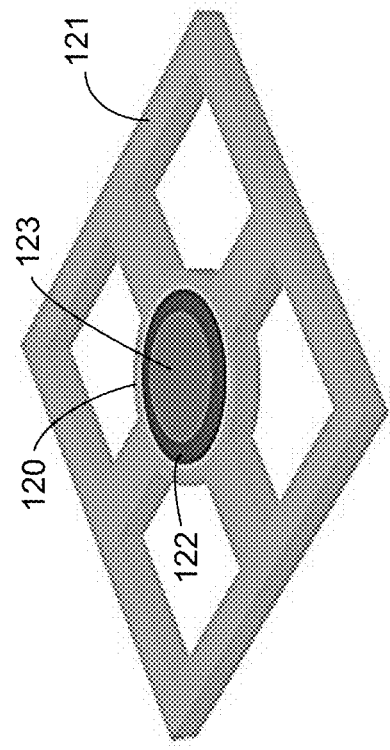
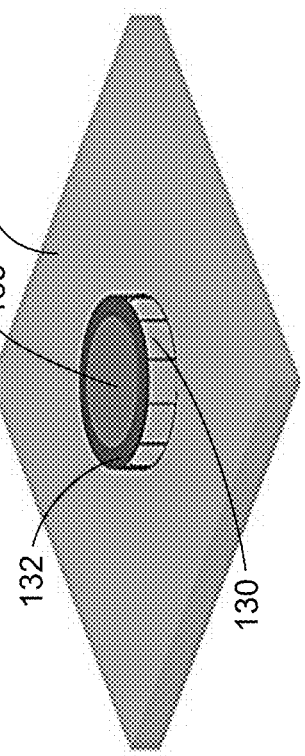
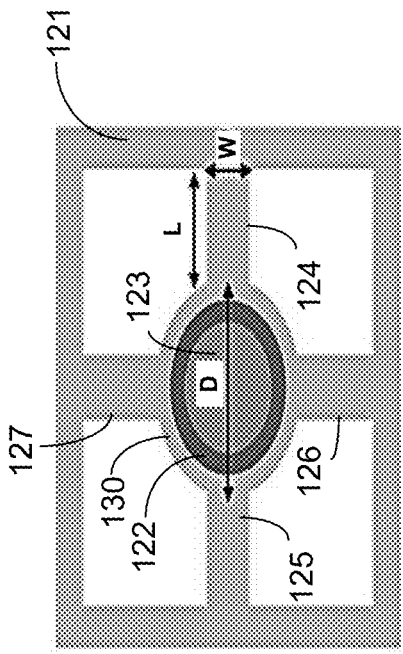
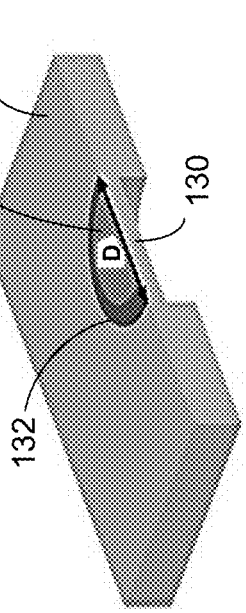

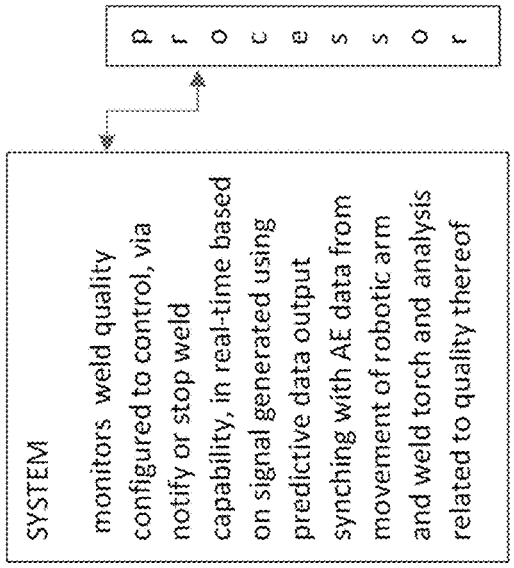
FIG. 14A  FIG. 14B  FIG. 14C
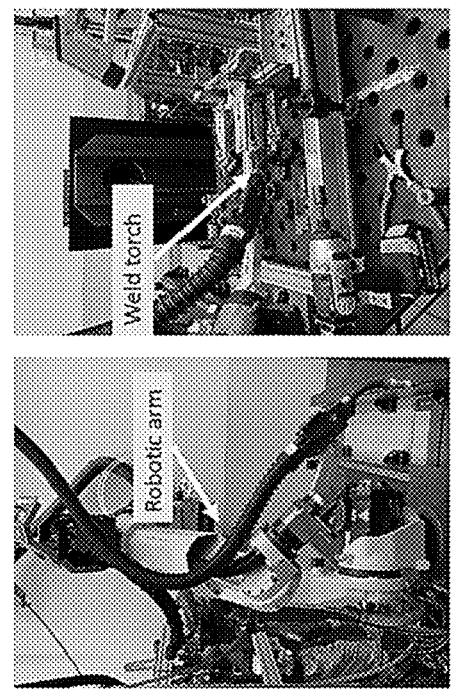
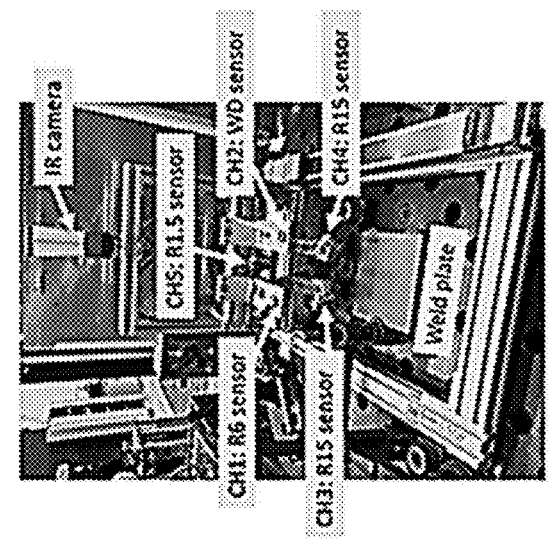
FIG. 15A
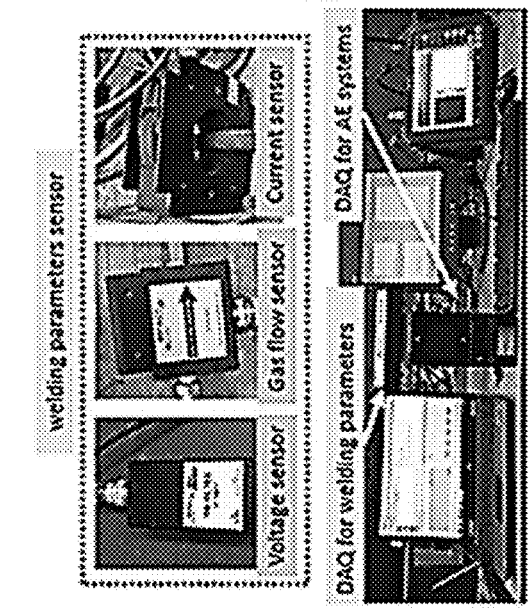
FIG. 15B

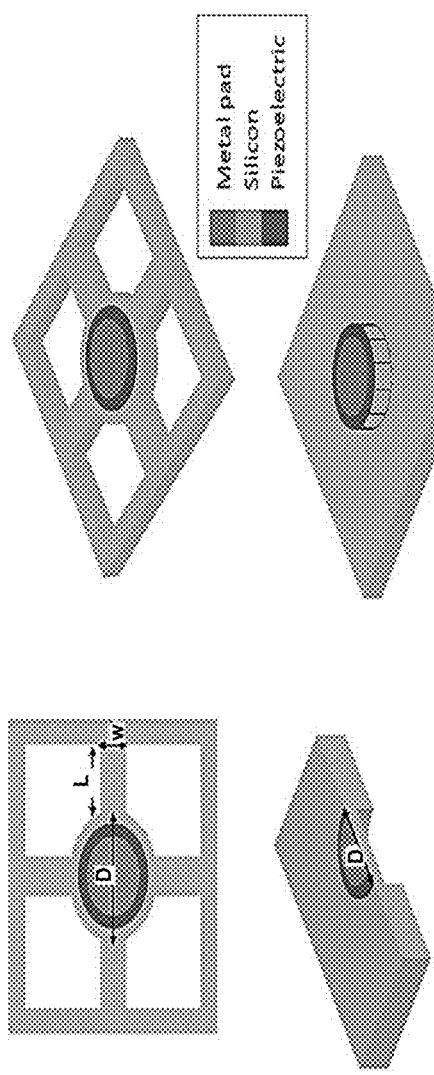
FIG. 28A
FIG. 28B
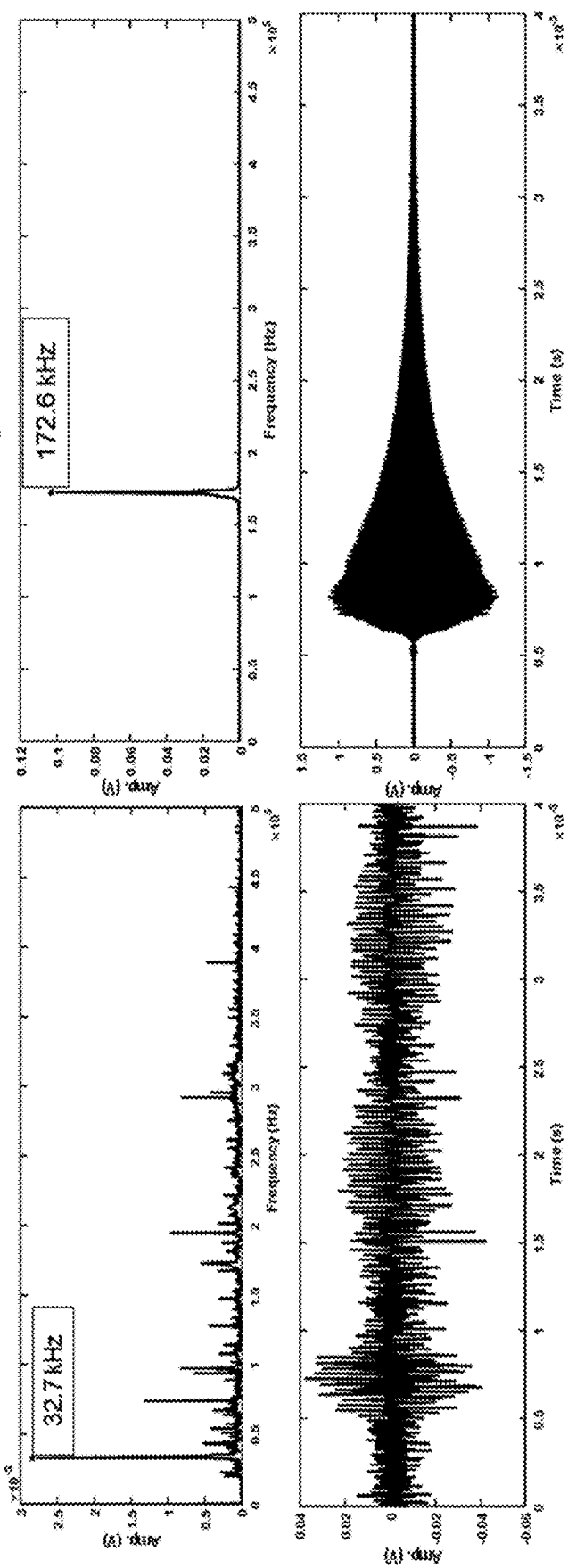
FIG. 29B
FIG. 29A

MULTI FREQUENCY ACOUSTIC EMISSION MICROMACHINED TRANSDUCERS FOR NON-DESTRUCTIVE EVALUATION OF STRUCTURAL HEALTH

CROSS-REFERENCE TO RELATED APPLICATIONS

This application is a national stage entry pursuant to 35 U.S.C. § 371 of Patent Cooperation Treaty (PCT) international application No. PCTUS2020/043282, filed on Jul. 23, 2020 which claims priority to, and the benefit of the filing date of, U.S. provisional application No. 62/877,593, filed on Jul. 23, 2019, entitled "MULTI FREQUENCY ACOUSTIC EMISSION MICROMACHINED TRANSDUCERS FOR STRUCTURAL HEALTH MONITORING," which are all hereby incorporated herein by reference in their entireties.

STATEMENT OF GOVERNMENTAL INTEREST

This invention was made with government support under Award No. CMMI 1552375 awarded by the National Science Foundation and Award No. 0220160026 awarded by DMDll. The government has certain rights in the invention.

TECHNICAL FIELD

The present disclosure relates to microelectromechanical systems (MEMS) acoustic emissions (AE) transducers for non-destructive evaluation (NDE) of structural health.

BACKGROUND

One of the well-established passive NDE methods for monitoring and evaluating structures is called Acoustic Emission (AE), in which elastic waves produced by sudden energy release of active flaws in a structure are detected by AE transducers. The AE method is used to monitor and evaluate various structures such as bridges as well as manufacturing processes. AE transducers are attached to the surface of the structure or embedded in the structure and receive the propagating elastic waves released from active flaws in the structures. In response to receiving the propagating elastic waves, AE transducers produce electrical responses that are monitored and evaluated to characterize the source of the propagating elastic wave.

Low power and lightweight MEMS AE piezoelectric transducers can be fabricated using MEMS fabrication processes. Capacitive MEMS transducers can also be fabricated using MEMS fabrication processes. Unlike capacitive MEMS transducers, MEMS AE piezoelectric transducers do not require a bias voltage and have a lower polarization voltage due to the manner in which the piezoelectrical layer operates.

Low power consumption and lightweight characteristics, along with high sensitivity, are important features of transducers used in NDE AE solutions. Although MEMS AE piezoelectric transducers meet the low power and lightweight characteristics desired for NDE AE solutions, the typically suffer from low sensitivity.

A need exists for a MEMS AE piezoelectric transducer solution that has the desirable low power consumption and lightweight characteristics desired for NDE AE solutions, while also achieving higher sensitivity desired for NDE AE solutions.

SUMMARY

In accordance with inventive principles and concepts of the present disclosure, examples are set forth of herein, a MEMS sensor system is set forth. The system includes more than one MEMS AE transducer, where each of the AE transducers in the system can be configured to generate an electromechanical response for a different frequency range. The system can be configured to collectively respond to acoustic emissions within the frequency ranges of each of the AE transducers.

In an embodiment, a MEMS sensor array can be configured of one or more AE transducer to perform substantially as indicated in Table V below.

In an embodiment, the system can be configured such that geometric dimensions of the AE transducer(s) are varied to tune to different frequencies.

In an embodiment, one of the AE transducers can be configured with a circular cross section. If desired, one or more of the AE transducers can be configured with an octagonal cross-section. The frequency of the AE transducers can span a broad frequency range, such as from 0.06 MHz to 4 MHz. If desired, the diameter of the AE transducers ranges from 50 to 500 micrometers. In an embodiment, each of the ultrasonic transducers can include a piezoelectric layer deposited up to $r_{opt}$.

In some embodiments the system can include a ceramic package for mounting the AE transducers. The AE transducers can be configured to transmit measurements of acoustic emissions. The system can be configured to generate a very narrowband response to reduce a measurement error in dispersive media (i.e., frequency-dependent wave velocity) such as, for example, pipelines and plates.

If desired, the AE transducers can be further defined by high Q factors. Further, each AE transducer can contain an effective area for depositing a piezoelectric layer, wherein the effective area can be selected to maximize current generation and minimize negative force effect for the system.

In an exemplary embodiment, a MEMS array can include at least two AE transducers connectable in series to form an AE sensor array for increased signal to noise ratio, frequency bandwidth and reduced cost. Each of the AE transducers can be configured to respond to different frequency ranges, the array utilizing one data acquisition channel to transmit acoustic emission data from the array.

In an embodiment, a MEMS acoustic emissions (AE) transducer system comprises at least first and second MEMS AE transducers integrated together in a chip. The first and second MEMS AE transducers operate over at least first and second frequency ranges, respectively, that are separate from one another. Each frequency range comprises one or more frequencies. The first and second MEMS AE transducers generate first and second electrical responses in response to receiving acoustic emissions in the first and second frequency ranges, respectively. The first and second electrical responses are output from the chip.

In an embodiment of the MEMS AE transducer system, the first and second electrical responses are electrically combined into a combined electrical response on the chip and are output from the chip over a single electrical channel of the MEMS AE transducer system.

In an embodiment of the MEMS AE transducer system, the first and second MEMS AE transducers are electrically coupled together in series such that the first and second electrical responses are combined into the combined electrical response prior to being output from the chip on the single electrical channel.

In an embodiment of the MEMS AE transducer system, the system further comprises a data acquisition system in communication with the chip. The data acquisition system receives the combined electrical response output on the single channel. The data acquisition system is configured to perform a signal processing algorithm that processes the combined electrical response to extract the first and second electrical responses from the combined electrical response.

In an embodiment of the MEMS AE transducer system, the first and second MEMS AE transducers are tuned to the first and second frequency ranges, respectively, by fabricating the first and second MEMS AE transducers according to first and second sets of design parameters, respectively.

In an embodiment of the MEMS AE transducer system, the first and second MEMS AE transducers each comprise: one or more electrically-conductive semiconductor layers comprising a first electrode; one or more metal layers comprising a second electrode; and one or more piezoelectric layers disposed in between and in contact with the first electrode and the second electrode.

In an embodiment of the MEMS AE transducer system, the one or more electrically-conductive semiconductor layers comprise one or more layers of N-doped silicon and the one or more piezoelectric layers comprise one or more layers of aluminum nitride.

In an embodiment of the MEMS AE transducer system, at least one of the first and second MEMS AE transducers has a four-beam design. Each beam is formed in the one or more electrically-conductive semiconductor layers. Each beam has a first end that is coupled to a central disk-shaped portion of the one or more electrically-conductive semiconductor layers and a second end that extends away from the first end and is coupled to an outer portion of the one or more electrically-conductive semiconductor layers.

In an embodiment of the MEMS AE transducer system, at least one of the first and second MEMS AE transducers has a diaphragm design. A diaphragm portion of the one or more electrically-conductive semiconductor layers comprises the first electrode of the MEMS AE transducer. The one or more layers of piezoelectric material is disposed on top of the diaphragm portion. The one or more layers of metal is disposed on top of the one or more layers of piezoelectric material to form the top electrode of the transducer on top of the diaphragm portion. The piezoelectric material is clamped about its circumference by the diaphragm portion of the one or more electrically-conductive semiconductor layers.

In an embodiment of the MEMS AE transducer system, the first MEMS AE transducer has the four-beam design and the second MEMS AE transducer has the diaphragm design.

In an embodiment of the MEMS AE transducer system, a highest frequency of the first frequency range is lower than a lowest frequency of the second frequency range, and a center frequency of the second frequency range is not a multiple of a center frequency of the first frequency range to ensure that the first and second electrical responses combine constructively when combined into the combined electrical response.

In an embodiment of the MEMS AE transducer system, a largest dimension of the chip is smaller than a smallest wavelength corresponding to the first and second frequency ranges.

In an embodiment of the MEMS AE transducer system, the system comprises an array of N MEMS AE transducers integrated together in a chip, where N is a positive integer that is greater than two. At least first and second MEMS AE transducers of the array operate over at least first and second frequency ranges, respectively, that are separate from one another. Each frequency range comprises one or more frequencies. The first and second MEMS AE transducers generate first and second electrical responses in response to receiving acoustic emissions in the first and second frequency ranges, respectively. The first and second electrical responses are combined into a combined electrical response and output from the chip on a single channel of the chip.

In an embodiment of the MEMS AE transducer system, at least the first and second MEMS AE transducers are electrically coupled together in series such that the first and second electrical responses are combined into the combined electrical response prior to being output from the chip on the single electrical channel.

In an embodiment of the MEMS AE transducer system, at least one of the first and second MEMS AE transducers has the four-beam design.

In an embodiment of the MEMS AE transducer system, at least one of the first and second MEMS AE transducers has the diaphragm design In an embodiment of the MEMS AE transducer system, the first MEMS AE transducer has the four-beam design and the second MEMS AE transducer has the diaphragm design.

In an embodiment of the MEMS AE transducer system, a method for performing NDE of the structural health of a structure comprises:
  coupling an NDE chip package to the structure, where the chip package comprises a chip comprises a MEMS AE transducer system comprising at least first and second MEMS AE transducers integrated together in the chip and operating over at least first and second frequency ranges, respectively, that are separate from one another to generate first and second electrical responses in response to receiving acoustic emissions in the first and second frequency ranges, respectively, the first and second electrical responses being combined into a combined electrical response and output from the chip package on a single channel of the chip package;
  with a data acquisition system in communication with the chip package, receiving the combined electrical response output on the single channel and performing a signal processing algorithm that processes the combined electrical response to extract the first and second electrical responses from the combined electrical response; and
  evaluating the first and second electrical responses to determine the structural health of the structure.

These and other features and advantages will become apparent from the following description, drawings and claims.

BRIEF DESCRIPTION OF THE DRAWINGS

FIGS. 12A and 12B show top plan and top perspective views respectively, of a MEMS AE transducer having the four-beam design shown in FIG. 1 in accordance with a representative embodiment.

FIGS. 13A and 13B show top perspective views of the MEMS AE transducer having the diaphragm design shown in FIG. 2 in accordance with a representative embodiment.

FIGS. 14A-14C illustrate the automated weld defect recognition system: robotic arm, weld torch and system.

FIGS. 15A and 15B illustrate the real-time monitoring system: The DAQ system of AE and welding and welding parameter sensor and the setup of AE sensors.

FIGS. 28A and 28B illustrate suggested geometries for sensors: 4-beam design and diaphragm design.

FIGS. 29A and 29B illustrate individual responses of 40 KHz and 200 KHz sensors in frequency and time.

DETAILED DESCRIPTION

Figure 2:
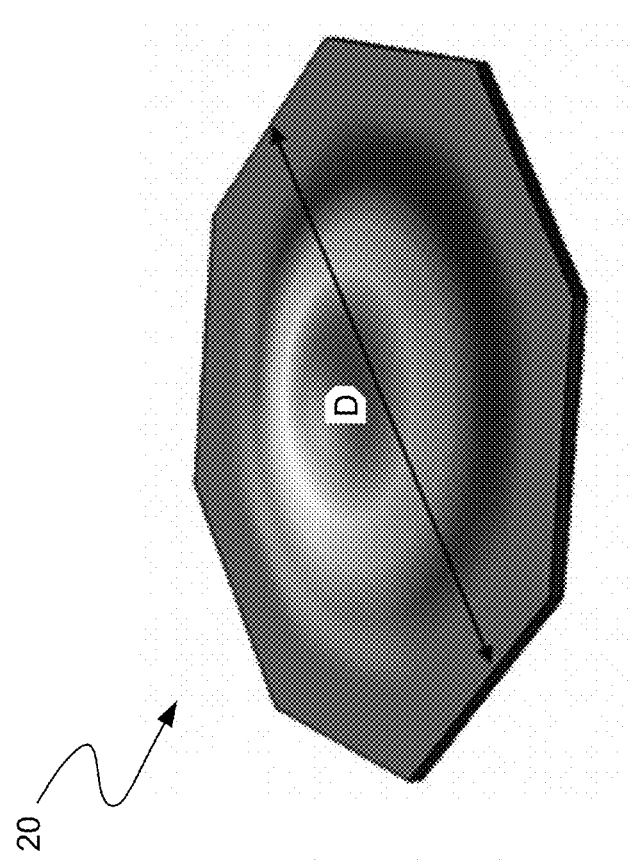
FIGS. 1 and 2 are top perspective views of examples of different structures of the MEMS AE transducer.

The present disclosure discloses a MEMS AE transducer system that takes advantage of the low power consumption and lightweight characteristics of MEMS AE transducers, while also achieving higher sensing sensitivity. To address the problem of low sensitivity typically associated with MEMS AE transducers, electrical responses of multiple MEMS AE transducers operating a different frequency ranges are combined to increase the bandwidth and sensitivity of the MEMS AE transducer system.

In the following detailed description, for purposes of explanation and not limitation, exemplary, or representative, embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only and is not intended to be limiting. The defined terms are in addition to the technical and scientific meanings of the defined terms as commonly understood and accepted in the technical field of the present teachings.

As used in the specification and appended claims, the terms "a," "an," and "the" include both singular and plural referents, unless the context clearly dictates otherwise. Thus, for example, "a device" includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

Exemplary, or representative, embodiments will now be described with reference to the figures, in which like reference numerals represent like components, elements or features. It should be noted that features, elements or components in the figures are not intended to be drawn to scale, emphasis being placed instead on demonstrating inventive principles and concepts.

In the present disclosure, the electromechanical characterization of the MEMS AE transducers is presented. The independent performance of each MEMS AE transducer is compared with the case in which they are connected in series to detect simulated AE events. Taking into account size, power consumption and weight, the MEMS AE transducer system of the present disclosure has significant advantages as compared to conventional bulky AE transducer systems.

In accordance with an embodiment, the MEMS AE transducers are connected to transmit over a single channel. As will be described below, advantages of this single-channel approach as compared to a multi-channel approach include: (a) reducing costs as the more channels that are used increases the cost and complexity of the monitoring system; (b) increasing signal amplitude as the signal amplitude of an electrical response produced by a single MEMS AE transducer is typically not sufficient to bring the signal level above electronic noise; and (c) simultaneously collecting multiple electrical responses of the respective MEMS AE transducers associated with respective frequencies simplifies source characterization.

The advantages of the AE system and method disclosed herein include detecting the initiation of damage, pinpointing its location, qualitatively assessing the severity of damage, and classifying the damage mode using pattern recognition tools. Pinpointing the source location requires determining signal arrivals and wave velocity. In most structures, velocity depends on frequency. Such structures are commonly referred to as dispersive medium. A slight change in frequency can impact wave velocity and the localization result. Conventional AE systems and methods require wave velocity as input. In accordance with embodiments disclosed herein, the frequency bandwidth associated with each MEMS AE transducer is narrowed down, which improves the accuracy of selecting the correct wave velocity for each frequency.

The MEMS AE transducers disclosed herein do not require a bias voltage, in contrast to capacitive MEMS sensors, which makes the MEMS AE transducer system more attractive for field implementation. In addition, because the MEMS AE transducer system output can be over a single channel, the complexity and cost of data acquisition equipment can be reduced. Another advantage of the system is that multiple MEMS AE transducers can be coupled together to increase the bandwidth and the sensitivity of the system.

In accordance with inventive principles and concepts disclosed herein, an array of the MEMS AE transducers can be connected together and tuned to different frequencies or frequency ranges to generate data outputs that are combined into a single channel. An example of such an array is disclosed herein along with design variables that are used to tune the MEMS AE transducers to the desired frequencies or frequency ranges. In addition, an experimental implementation of the system is disclosed herein that incorporates 40 kHz and 200 kHz MEMS AE transducers.

Each MEMS AE transducer can be modeled as a mass-spring-damper system with the under-damped state. Considering a linear elastic model with the lumped mass assumption for individual mechanical resonator, the response is calculated as:

$$\frac{D_i(s)}{F(s)} = \frac{\omega_{ni}^2}{k_{ni}\left(s^2 + \frac{\omega_{ni}}{Q_i}s + \omega_{ni}^2\right)}$$

where D is the displacement, F is the applied force, $\omega_n$ is the natural frequency, $k_n$ is the elastic constant, Q is the quality factor, s is the Laplace variable and i is the number of resonators. Assuming the input signal is broadband, the total displacement output of m resonators is simply the linear summation of the individual displacement responses:

$$D_{total}(s) = F(s)\sum_{i=1}^{m}\frac{\omega_{ni}^2}{k_{ni}\left(s^2 + \frac{\omega_{ni}}{Q_i}s + \omega_{ni}^2\right)}$$

The sensing mechanism is based on generating electrical charge associated with the structural deformation induced in the piezoelectric layer by vibrations in the adjacent semiconductor material layer.

Figure 1:
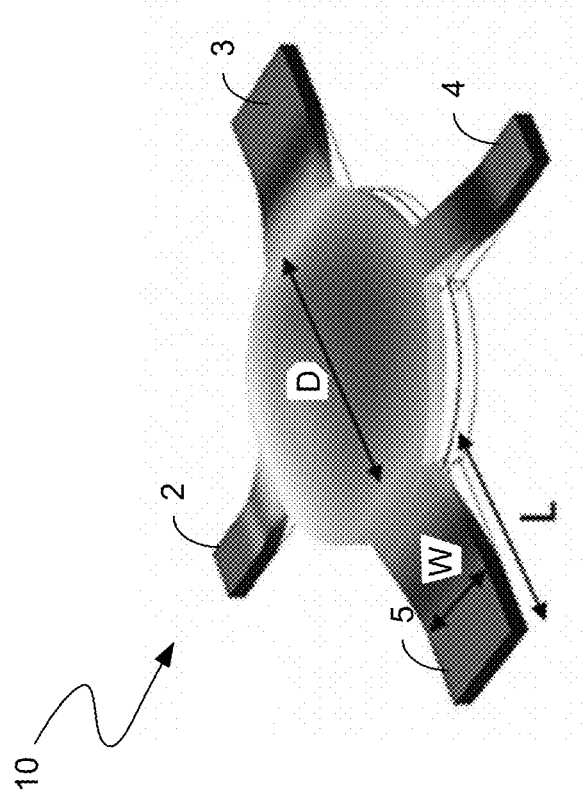

FIGS. 1 and 2 are top perspective views of examples of different structures of the MEMS AE transducers 10 and 20, respectively. Piezoelectric MEMS AE transducers can be made in a variety of ways, and therefore the inventive principles and concepts are not limited to the structures or shapes shown in FIGS. 1 and 2. In FIG. 1, the transducer 10 is configured to attach to a substrate (not shown) via four cantilever arms 2-5. In FIG. 2, the transducer 20 is configured as a thin circular diaphragm clamped around its circumference. In piezoelectric Multi-user MEMS Processes (piezoMUMPs), layer thicknesses are restricted by the manufacturing process. The dimensions shown in FIGS. 1 and 2 are variable within limits of specific ranges of minimum and maximum values provided by the manufacturer. In FIGS. 1 and 2, the major parameters that can be selected to tune the transducers 10 and 20 to the targeted frequencies or frequency ranges are shown. The resonant frequency of the four-beam design of the transducer 10 is correlated to the stiffness of the clamped beams 2-5 and to the mass of the moving membrane. For the four-beam design shown in FIG. 1, the stiffness of the device is assumed to be equal to the summation of the stiffnesses of the four cantilever beams. 2-5. Each transducer 10 can be tuned to a particular frequency by varying one or more of the diameter (D), width (W) and length (L) dimensions.

As an example, MEMS AE transducers manufactured using a Piezoelectric Multi-User MEMS Process (PiezoMUMPs) provided by MEMSCAP foundry are made of silicon mass with an Aluminum Nitride (AlN) layer underneath it that is attached to the four cantilever elements 2-5. This configuration reduces the total size of the transducer 10 for operating at a lower frequency as compared to the fully clamped diaphragm design of the transducer 20 shown in FIG. 2. The transducer 20 shown in FIG. 2 is tuned to the targeted frequency or frequency range by selecting the diameter D. It should be noted, however, that the inventive principles and concepts are not limited with respect to the process that is used to manufacture the MEMS AE transducer system of with respect to the manufacturer that performs the process.

Figure 4:
FIG. 4 is a photograph of the system shown in FIG. 3 installed on a flat ceramic package and having several probes connected to the package leads.
Figure 3:
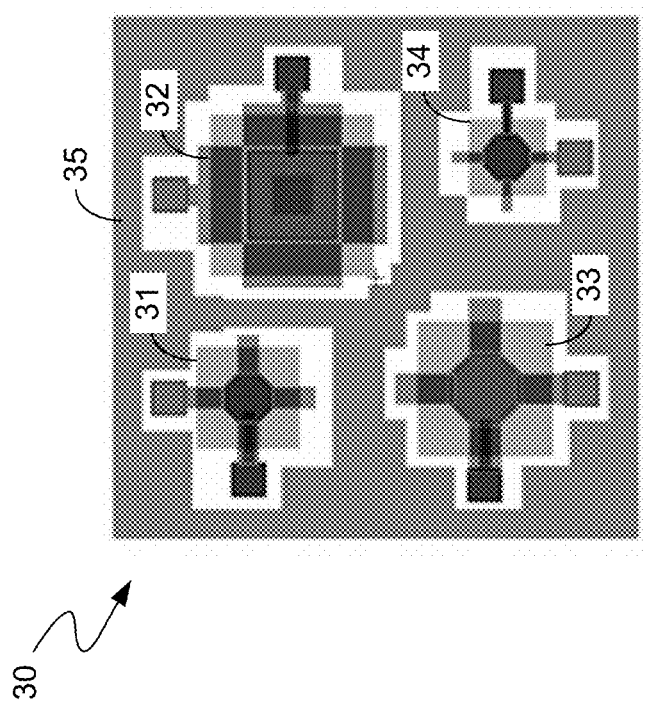
FIG. 3 shows an example of the MEMS AE transducer system having a small footprint and comprising four transducers formed on a wafer.

FIG. 3 shows an example of the MEMS AE transducer system 30 having a small footprint and comprising four transducers 31-34 formed on a wafer 35 (e.g., a 5 mm×5 mm silicon wafer). FIG. 4 is a photograph of the system 30 shown in FIG. 3 installed on a flat ceramic package and having several probes connected to the package leads. It should be noted that the inventive principles and concepts are not limited with respect to the number of transducers that the system comprises or with respect to the size of the system or the size of the package in which it is installed. The small footprint that the MEMS AE transducer system can have is, however, one of the advantages of the MEMS AE transducer system over other known transducer systems that are used for structural health monitoring.

Figures 5A, 5B, 5C:
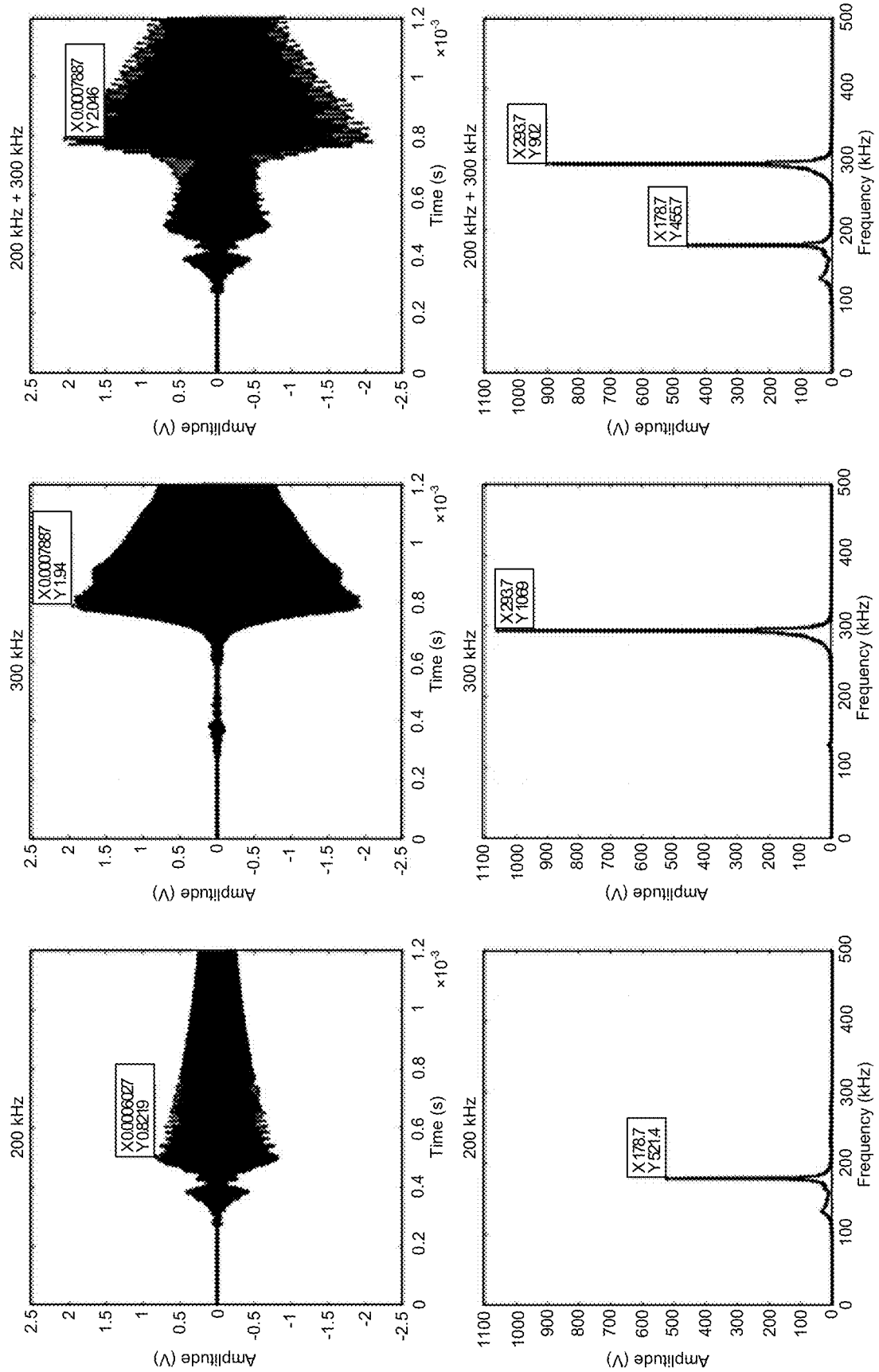
FIGS. 5A and 5B are time domain plots of the amplitudes of the signals output from first and second MEMS AE transducers, respectively, operating at first and second frequencies or frequency ranges, respectively.
FIG. 5C is a time domain plot of the amplitude of the combined signals output from first and second transducers shown in FIGS. 5A and 5B.

As indicated above, another advantage of the MEMS AE transducer system is that the responses of multiple MEMS AE transducers operating at multiple respective frequencies can be output on a single channel. This reduces system complexity and costs and produces a signal amplitude that is above the noise floor. FIGS. 5A and 5B are time domain plots of the amplitudes of the signals output from first and second transducers operating at first and second frequencies or frequency ranges, respectively. In this example, the first and second frequencies are 200 kHz and 300 kHz, respectively. The first and second transducers can have the configurations of the transducers 10 or 20 shown in FIG. 1 or 2, respectively. FIG. 5C is a time domain plot of the amplitude of the combined signals output from the first and second transducers onto a single channel of the system. As the frequencies are constructive, the combined response on a single channel as shown in FIG. 5C is the actual summation of two signals with an improved signal to noise ratio. Additionally, each frequency can be decomposed as they are well separated from each other due to the super narrowband response and high Quality (Q) factor of the MEMS AE transducer.

Figure 6:
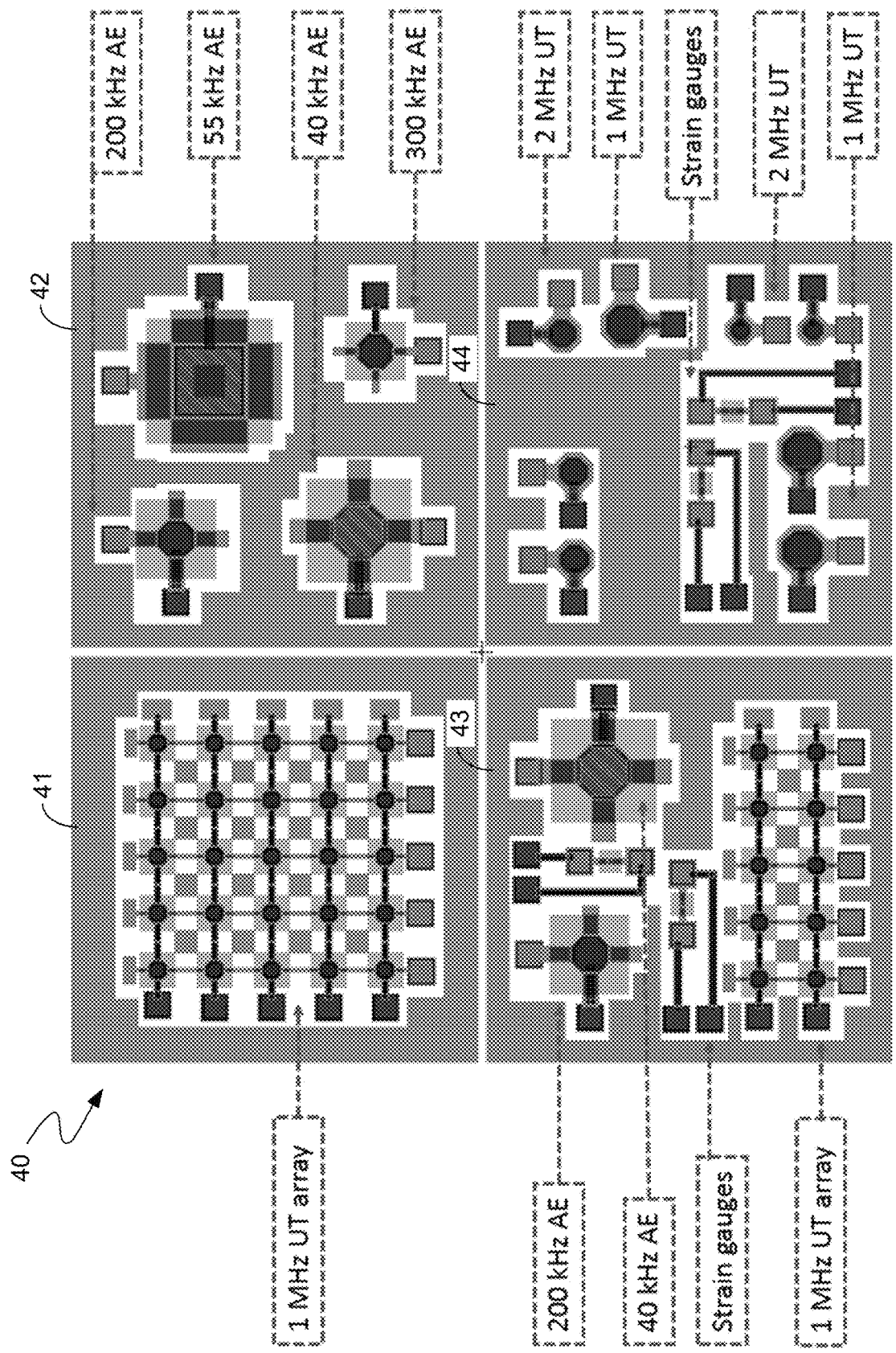
FIG. 6 shows an example of a 10 mm×10 mm MEMS AE transducer chip manufactured by PiezoMUMPs that has been subdiced into four 5 mm×5 mm chips; the chips have different configurations of MEMS AE transducers on them that operate at different frequencies to allow testing different design configurations and reducing the sensor size.

PiezoMUMPs allow subdicing a 10 mm×10 mm chip into four 5 mm×5 mm chips. FIG. 6 shows an example of a 10 mm×10 mm MEMS AE transducer chip 40 manufactured by PiezoMUMPs that has been subdiced into four 5 mm×5 mm chips 41-44. The chips 41-44 have different configurations of MEMS AE transducers on them that operate at different frequencies. This allows testing different design configuration and reducing the sensor size. The layout of chip 41 is a 2-D array of ultrasonic (UT) MEMS AE transducers that are electrically interconnected operating at 1 MHz. The layout of chip 42 is four different MEMS AE transducers tuned to 40 kHz, 55 kHz, 200 kHz and 300 kHz by changing the mass diameter and the size of the transducers. The layout of chip 43 is two different MEMS AE transducers tuned to 40 kHz and 200 kHz, a 2×5 array of UT MEMS AE transducers operating at 1 MHz and a strain gauge. The layout of chip 44 is multiple different MEMS AE transducers tuned to 1 MHz and 2 MHz and two strain gauges. Thus, it can be seen that the MEMS AE transducer system can have a variety of configurations while still achieving a very small footprint.

Some of the benefits of the layouts shown in FIG. 6 include providing an incremental increase of amplitude for the transducers with the same frequency, providing a broadband response for the transducers with different frequencies, and providing single-channel acquisition.

Figure 7:
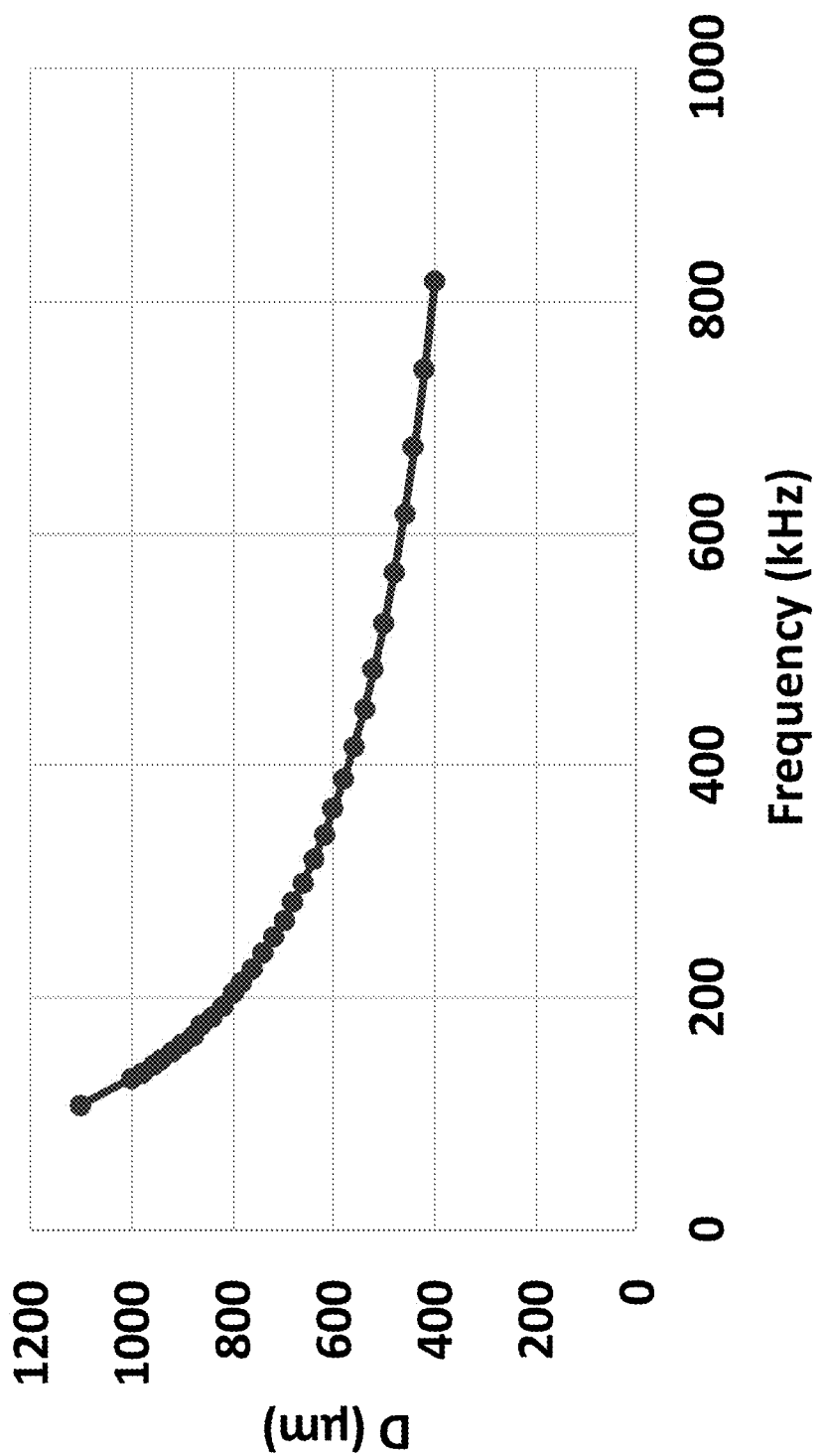
FIG. 7 is a plot of frequency as a function of diameter of the diaphragm design shown in FIG. 2 that demonstrates that increasing the diameter tunes the transducer to a lower frequency, and vice versa, in a nonlinear manner.

As indicated above, the transducers can be designed as, for example, a diaphragm anchored from the circumference or as four-beam connected to the mass. The diaphragm design can be designed for a targeted frequency in accordance with the following equation:

$$f = 0.47 \frac{t}{a^2} \sqrt{\frac{E}{\rho}}$$

where f is the targeted frequency, a is the radius of the diaphragm D/2, t is the thickness of the diaphragm, E is Young's Modulus and ρ is density. Young's Modulus and density are controlled by the vibrating layer, which is typically silicon. FIG. 7 is a plot of frequency as a function of diameter of the diaphragm design shown in FIG. 2. As seen in FIG. 7, increasing the diameter tunes the transducer to a lower frequency, and vice versa, in a nonlinear manner.

Figure 8:
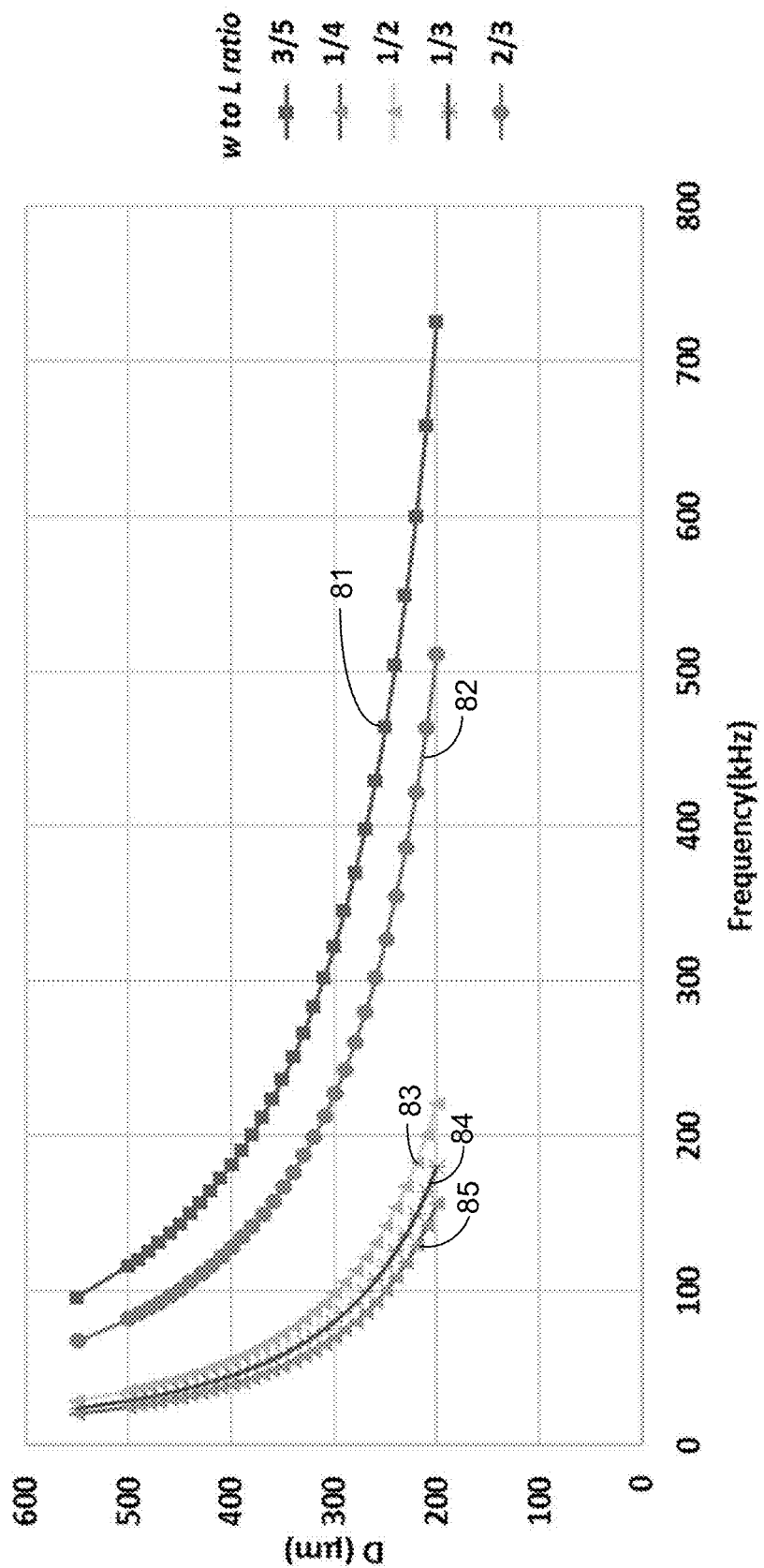
FIG. 8 is a plot of targeted frequency as a function of diameter for the four-beam design shown in FIG. 1; each of the curves corresponds to a different width-to-length ratio, w/L for the beams.

As indicated above, for the four-beam design, the main design variables are beam length (L), the beam width (w) and the mass diameter (D). Beam length and width control stiffness (k). Mass diameter controls total mass (m). FIG. 8 is a plot of targeted frequency as a function of diameter for the four-beam design shown in FIG. 1 Each of the curves 81-85 corresponds to a different width-to-length ratio, w/L for the beams. Curve 81 corresponds to a 3/5 w/L ratio. Curve 85 corresponds to a 1/4 w/L ratio. Curve 83 corresponds to a 1/2 w/L ratio. Curve 84 corresponds to a 1/3 w/L ratio. Curve 82 corresponds to a 2/3 w/L ratio. These curves 81-85 demonstrate the manner in which the four-beam design can be tuned to different frequencies. The targeted frequency can also be expressed as:

$$f = 2\pi \sqrt{\frac{k}{m}}$$

where k is the stiffness and m is the total mass. Thus, for the four-beam design, the beam length and width control the stiffness k and the mass diameter D controls total mass m).

The deformed shape of diaphragm can be represented by transverse displacement due to uniform loading. The charge produced by the transducer 20 shown in FIG. 2 can be expressed as:

$$q(r) = d_{31} T_{piezo}(r)$$

where $d_{31}$ is the polarization coefficient and $T_{piezo}(r)$ is the force applied to the piezoelectric layer. Once the diaphragm vibrates due to external stimulus, it applies an axial force (T) to the piezoelectric layer that is converted into an electrical signal by piezoelectric polarization coefficient, $d_{31}$. For the case of diaphragm that is fully anchored around its circumference of support, the axial force is compressed (negative) near the support, and tension (positive) near the middle. The transition point is called inflection point, which can be determined by an elastic displacement curve of the diaphragm. To prevent the cancellation of electrical current due to negative and positive axial forces, the piezoelectric film should be deposited between inflection points around the circumference.

Figure 9:
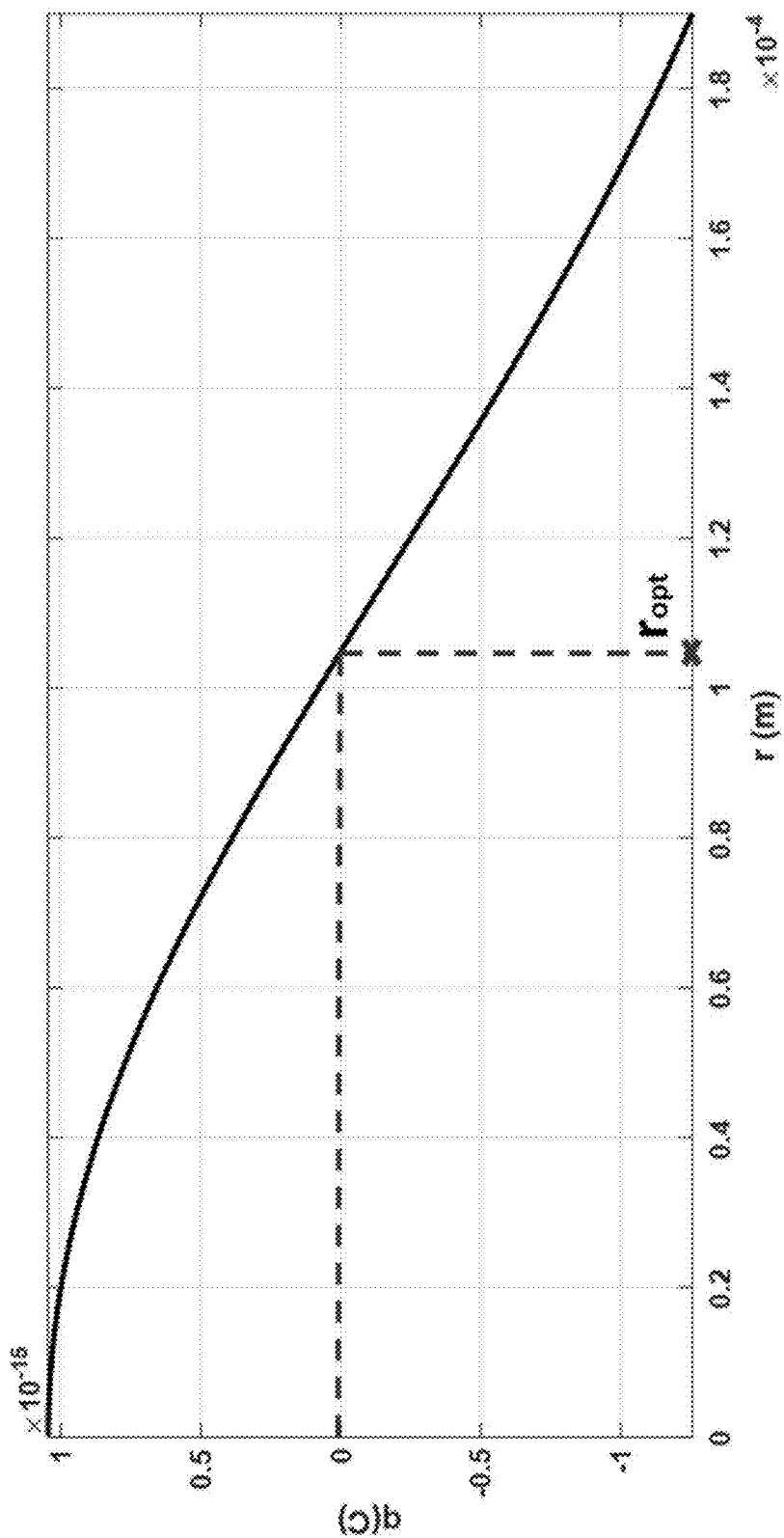
FIG. 9 is a plot of the electrical charge produced by the transducer having the diaphragm design shown in FIG. 2 as a function of the radius, a, of the diaphragm.

FIG. 9 is a plot of the electrical charge produced by the transducer 20 as a function of the radius a of the diaphragm. There is an optimum radius, $r_{opt}$, where only positive charge is produced. If the piezoelectric layer is deposited up to $r_{opt}$, the influence of negative charge to the cumulative charge produced will be eliminated, as shown in FIG. 9.

Figures 10A, 10B, 10C:
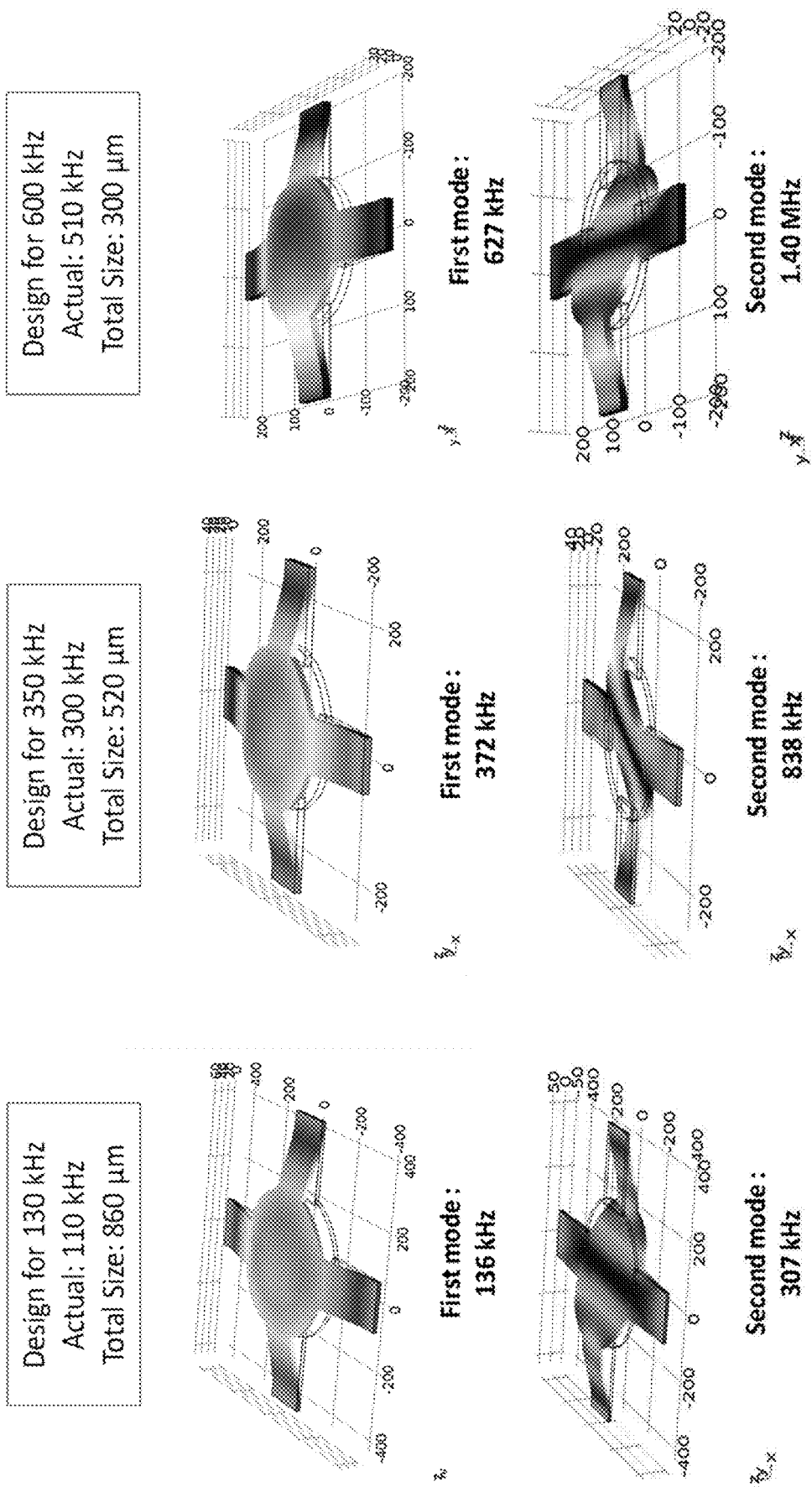
FIGS. 10A-10C show first and second modes of operations for numerical models of the four-beam suspended mass design shown in FIG. 1 for different tuning frequencies.

This is not an issue for four-beam design shown in FIG. 1 as the entire mass is under tensile force; therefore, it is a preferred design for piezo MEMS AE transducers. FIGS. 10A-10C show the first and second modes of operations for numerical models of the four-beam suspended mass design shown in FIG. 1 for different tuning frequencies. The operational frequency of each transducer is computed using COMSOL Multiphysics software and eigenvalue analysis. The first mode generates the highest and the most uniform axial force on the mass where the piezoelectric film is deposited. Therefore, this is the mode of interest. By changing the total size of transducer from 860 um (FIG. 10A) to 300 um (FIG. 10C), the design frequency is changed from 130 kHz (FIG. 10A) to 600 kHz (FIG. 10C). In these examples, the "total size" is calculated as the distance from the far end of one of the cantilever beams to the far end of the opposite cantilever beam. It can be observed that there is a difference in the design frequency and the actual transducer frequency after manufacturing due to the influence of manufacturing variables, such as materials properties. The ratio between the actual frequency and the design frequency is identified as about 0.85. FIGS. 10A-10C demonstrate the manner in which the four-beam design can be tuned to different frequencies of operations by adjusting the aforementioned parameters, D, w and L.

Figures 11A, 11B, 11C:
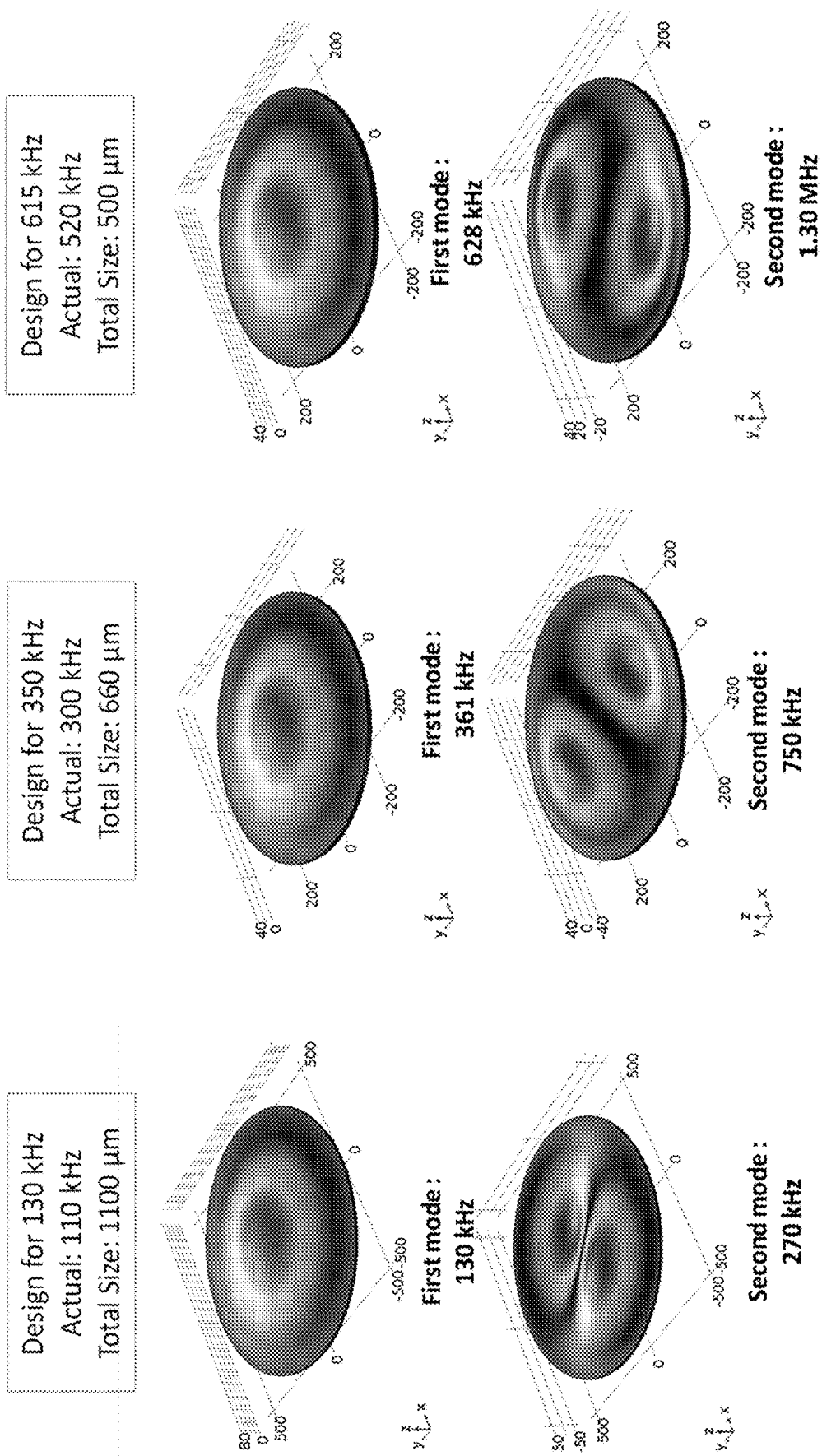
FIGS. 11A-11C show first and second modes of operations for numerical models of the diaphragm design shown in FIG. 2 for different tuning frequencies.

FIGS. 11A-11C show the first and second modes of operations for numerical models of the diaphragm design shown in FIG. 2 for different tuning frequencies. These figures show three diaphragm designs tuned to different frequencies by changing the diaphragm diameter D. As compared to the four-beam design, the size of diaphragm should be significantly larger to tune the transducer to a lower frequency. For instance, the transducer size is 1100 um for tuning to 130 kHz using the diaphragm design shown in FIG. 11A while the size of the transducer is 860 um for the same frequency using the four-beam design shown in FIG. 10A. This means that more transducers can be connected in the same area using the four-beam design as compared to the diaphragm design.

FIGS. 12A and 12B show top plan and top perspective views, respectively, of a MEMS AE transducer having the four-beam design discussed above in accordance with a representative embodiment. The base of the MEMS AE transducer comprises one or more layer of an electrically-conductive semiconductor material 121 (e.g., N-doped silicon), the central disk-shaped portion 120 of which forms the bottom electrode of the transducer. One or more layers of piezoelectric material 122 are disposed on top of the central disk-shaped portion 120. One or more layers of metal 123 are disposed on top of the piezoelectric material 122 to form the top electrode of the transducer. Each cantilever beam 124-127 has a first, or proximal, end that is coupled to the central disk-shaped portion 120 and a second, or distal, end that extends away from the first end and is coupled to an outer portion of the semiconductor material 121. The transducer is tuned to a target frequency in the manner described above by selecting the appropriate design parameters.

FIGS. 13A and 13B show top perspective views of the MEMS AE transducer having the diaphragm design in accordance with a representative embodiment. The base of the MEMS AE transducer comprises one or more layer of an electrically-conductive semiconductor material 131 (e.g., N-doped silicon). A diaphragm portion 130 of the semiconductor material 131 forms the bottom electrode of the transducer. One or more layers of piezoelectric material 132 are disposed on top of the diaphragm portion 130. One or more layers of metal 133 are disposed on top of the piezoelectric material 132 to form the top electrode of the transducer. In accordance with this embodiment, the piezoelectric material 132 is anchored or clamped about its circumference by the semiconductor material 131 that forms the diaphragm portion 130. FIG. 13B shows the transducer after one or more layers of the semiconductor material 131 have been stripped away to define the outer diameter of the diaphragm.

It can be seen from the above discussion that the MEMS AE transducer system has several advantages over other types of sensors used in structural health monitoring. The MEMS AE transducers disclosed herein have highly narrowband responses, which have the advantages of accurate velocity selection in source localization and the ability to combine the responses into a single channel, which provides other advantages such as, for example, increased signal-to-noise ratio, reduced complexity and cost of signal acquisition circuitry, and increased bandwidth. However, combining multiple responses of multiple MEMS AE transducers on a single channel indicates that the selection of frequencies is important to preventing signal cancelling in adding their transient outputs. The selected frequencies should not be integers to prevent the signal cancellation. The foregoing discussion shows that individual frequencies can be successfully separated. The total area of the entire device should be less than the minimum wavelength to eliminate the aperture effect, which is related to the wavelength of the incoming wave causing the vibration of sensors. If total device size is larger than the wavelength of incoming wave, each transducer may respond separately, which may result in signal cancellation. The largest dimension of the MEMS AE transducer system (i.e., the largest dimension of the chip comprising the multiple transducers) should be smaller than the smallest wavelength of the incoming waves that the transducer system is tuned to sense.

Real-Time Machine Learning Weld Quality Inspection System

In accordance with the principles herein, an automated weld defect recognition system is set forth. In an embodiment, the automated weld defect recognition system can include an inspection tool configured to transmit non-contact acoustic sensor data acquired from acoustic emissions in the region of a welder during travel of the welder in a weld process. The system can include a processor configured to directly or indirectly receive the acoustic sensor data from the inspection tool. The processor can be configured to analyze and recognize a weld defect via a weld defect detection circuit. The processor can also be configured to at least one of generate an output indicating a defect for a connectable display and generate a stop signal to stop the welder based on the output of the weld defect detection circuit.

In an exemplary embodiment, the system can be configurable to accommodate different weld types. For example, in certain embodiments the weld types can be further defined by GTAW and GMAW, or any other suitable weld type.

In an exemplary embodiment, the weld defect detection circuit can be configured to synchronize time data of the system with the acoustic sensor data received from either the inspection tool or directly from the acoustic sensor.

In an exemplary embodiment the system can further include weld parameter sensors. If desired, the system can include a data storage loadable with training data acquired via the system. The data storage can connect to the system via a wired or wireless connection to the processor. The data storage can be configured to store a predictive model data, where the system can be configured to generate and send to a display connectable to the system a predictive model for the system based on inputs received from the inspection tool. The system can be configured to update the data storage based on selected features from the inspection tool and system.

In an exemplary embodiment, the system can further include a machine learning algorithm connectable to the data storage configured to analyze and categorize weld defects to update the predictive model based on data received via the system. The system can be configured to automatically recognize defects via the weld detection circuit, and to automatically stop the welder during operation.

The system can include an output and offset adjustment device configured to selectively adjust a synchronization process between the acoustic sensor data and the time data in the data storage. The system can further include heat input data received via the processor from current, voltage and travel speed sensors of the inspection tool.

The system can acquire acoustic sensor information from any suitable acoustic emission detector. For example, in an exemplary embodiment the system can further include a MEMS sensor system including: more than one MEMS acoustic emission transducer, where each of the acoustic emission transducers in the system can be configured to generate an electromechanical response for a different frequency range. The system can be configured to collectively respond to acoustic emissions within the frequency ranges of each of the acoustic emission transducers via a single channel.

DESCRIPTION

Automated welding has the potential to increase the efficiency and productivity for a number of industries. At the same time, welding processes and systems are complex, due to unexpected defects that can occur in the manufacturing process, which ultimately lead to significant negative impacts on the weld products. In order to insure the weld quality, evaluation approaches are a critical component of the welding procedure. Currently, there are variety of weld quality monitoring methods, such as X-ray, ultrasonic testing, and relative mechanical testing, etc. However, inspections are currently usually conducted either destructively or in the post-weld stage. If defects are found in welded product, few of them can be remedied. This may result in the disposal of expensive material decreasing overall productivity. Therefore, an efficient, nondestructive weld quality monitoring system is needed in order to be able to automate the process. In accordance with the principles herein, a system configured to enable visible light imaging, acoustic emission and/or thermal-based imaging are achievable, mainly in real-time, according to a wide variety of weld monitoring systems and methods, where a few examples of systems contemplated are described herein.

With proper real-time weld monitoring systems and methods constructed in accordance with the principles herein, weld defects can be recognized, and the system or welder can correct the current weld parameter immediately. Whether in a manual or an automated weld process, the experience of the welder is a decisive factor. But with mass production of weld in assembly line, it is difficult for the welder to make a rapid and appropriate decision with many parameters from the welding machine and monitoring system. Meanwhile, with a manual decision involved, the automaticity of the weld is limited. Aiming to remedy this situation, intelligent decisions in response to process and monitoring variables in accordance with the principles herein offers a great potential solution. Through building the training set, machine learning algorithms of the systems and methods herein can analyze data acquired during the weld including weld parameter and monitoring variables, and assess the weld quality resulting in a reasonable assessment.

Systems constructed in accordance with the principles herein can be configured to keep collected data and improve the training set during the weld, such that the accuracy of the machine learning algorithm can be improved over time and during operation. Many applications of using intelligent algorithms can be found in literature. For example, tree based machine learning algorithms have been used in establishing correlation of acoustic signals with weld quality using post-processing acoustic feature extraction, naïve bayes, support vector machines and neural network have been used to monitor weld quality from acoustic signals in shielded metal arc welding, neural network based analysis has been performed to measure welding skills.

However, these systems lack the ability to provide an analysis of the weld quality to the system or an operator in real-time, whereas systems constructed in accordance with the principles herein enable the weld process to be stopped during operation. To this end, acoustic emissions (AE) associated with weld parameter monitoring are collected in real-time via monitoring methods and system components for automated welding. Since a variety of acoustic activities are generated within the welding process, acoustic-based non-destructive evaluation (NDE) applications in welding can be found in the literature. By analyzing the acoustic information produced during a weld, the plasma plume, penetration of bead, processing, weld defect and inclusion can be identified. However, NDE methods in most cases establish the correlations based on the observation and post-signal processing technique. In this way, important subtle relationships are ignored, and limited data can be processed, leading to low efficiency. Therefore, the application of NDE real-time monitoring in weld was hindered.

The automated weld demands a weld system and method that can rapidly process the massive signals and identify the abnormality itself. In this case, a suitable system for identifying abnormalities, such as a machine learning algorithm portion of some exemplary systems herein, can provide a solution. A machine learning algorithm can be configured to take features extracted from the available signals, and during a training phase learns their importance's for corresponding target variables. Using the same feature extraction method and the learned weights, the machine learning algorithm can then predict the target variables in real-time. Thus, an automated defect monitoring system can be achieved by utilizing machine learning methods, which would save time from post-weld inspection. On the other hand, it can reduce dependence on human experts, or assist human monitors to notice missed detection.

In accordance with the principles herein, several features can be extracted from the AE signals that are useful in defect detection. By comparing two methods of machine learning, one considering each timestep as an individual prediction task, and another considering the weld as a continuous sequence from the start, features can be identified and correlated with a useful outcome to achieve a system configured to facilitate real-time automated weld processes.

In order to reproduce the process of automated weld in the manufacturer, a gas metal arc welding (GMAW) was conducted in the laboratory. The ambient noise, vibration, and temperature are close to the weld production environment. The weld torch was mounted on and automatically controlled by a robotic arm, which can realize the 3-dimensional motion, shown in FIGS. 14A and 14B. FIG. 14C illustrates the monitoring system of the weld fabrication entailed two components: welding parameter monitoring, and AE monitoring in FIG. 15A. The real-time welding parameters (current, voltage and gas flow) were collected using ARCAgent 3000P system with the Centerpoint software provided by Miller. The sampling rate of recording the welding parameters was 0.1 second. The AE data was recorded using PCI-8 data acquisition board manufactured by Mistras Group Inc, see in FIG. 15A. In order to decrease the error due to the spatial influence, four types of AE sensors were attached to a motorized scanner developed in air-coupled mode, see in FIG. 15B: 1×R6 (resonant type sensor with the frequency range of 35-100 kHz), 1×WD (wideband type sensor with the frequency range of 100-900 kHz), 1×R1.5 (low frequency resonant type sensor with the frequency range of 5-20 kHz), and 2×R15 (narrow band resonant type sensor with highest sensitivity of range of 150 kHz). The setup of the AE sensors is shown in FIG. 15B. The major data acquisition variables are the digital filter as 20-400 kHz for R6, 100-400 kHz for WD and R15, and 1-50 KHz for R1.5, which can be selected to have enough frequency range to cover all of the possible AE activity during weld. The threshold level can be set as 45 dB, for example. All of the sensors can be connected to 40 dB pre-amplifier, if desired. AE waveforms can be recorded with 3 MHz sampling rate for WD and R15; for the R6 and the R1.5, the sampling rate can be 1 MHz. All of the sensing components can be synchronized with the speed of a welding torch.

Weld Sample Preparation: Introduction of Weld

The bead-on-plate (BOP) of GMAW was conducted on the high-strength and low-alloy steel (HSLA 350) plate with the dimension of 15 cm×15 cm×0.32 cm (length×width× thickness); and the filler material is Lincoln ER70S6 wire with mild steel core and copper coating. The shielding gas is mixing Oxygen with Argon. Each specimen was clamped onto the welding table to prevent warping during the welding process. Two scenarios of weld were investigated: (i) penetration, and (ii) porosity. Different weld penetration and porosity inclusions were introduced by varying wire speed and gas flow rate in shielding gas, respectively. The change of wire speed influences the weld current and voltage, leading the weld heat input change. A total of 52 samples were prepared, where the input weld parameters and expected defects are summarized in Table 1. The sample naming follows that P stands for penetration, PO means porosity, the number stands for the level. Herein, from P1 to P1PO2, the same weld was repeated for 3 times to assure the repeatability. And P1PO3 and P7PO3 same weld settings were repeated for 5 times.

TABLE 1

Number of samples in each group is shown in parenthesis.

| Sample Group Name and number of tests | Wire Speed (in/min) | Gas Flow (ft³/h) | Travel Speed (mm/s) | Heat Input (KJ/mm) |
| --- | --- | --- | --- | --- |
| P1 (3) | 200 | 40 | 11 | 0.38 |
| P2 (3) | 160 | 40 | 11 | 0.30 |
| P3 (3) | 120 | 40 | 11 | 0.20 |
| P4 (3) | 100 | 40 | 11 | 0.18 |
| P5 (3) | 240 | 40 | 11 | 0.49 |
| P6 (3) | 260 | 40 | 11 | 0.52 |
| P7 (3) | 280 | 40 | 11 | 0.58 |
| P8 (3) | 300 | 40 | 11 | 0.60 |
| P1PO1 (3) | 200 | 25 | 11 | 0.39 |
| P1PO2 (3) | 200 | 21 | 11 | 0.40 |
| P1PO3 (5) | 200 | 12 | 11 | 0.39 |
| P7PO3 (5) | 280 | 12 | 11 | 0.56 |
| P7PO4 (1) | 280 | 56 | 11 | 0.56 |
| P7PO5 (1) | 280 | 59 | 11 | 0.56 |

The Criterion of Weld Categorization

Figure 16:
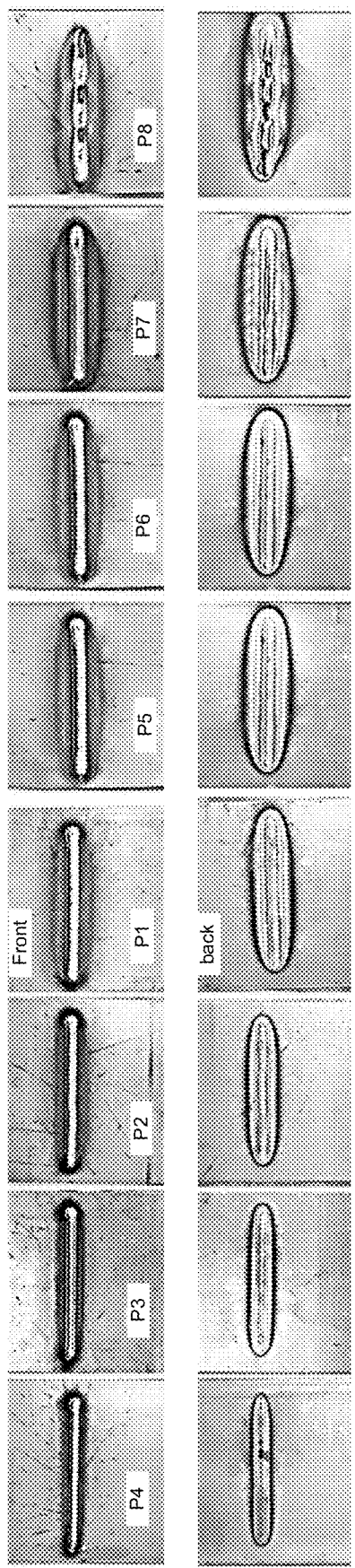
FIG. 16 illustrates the profile of weld line without porosity inclusion.
Figure 17:
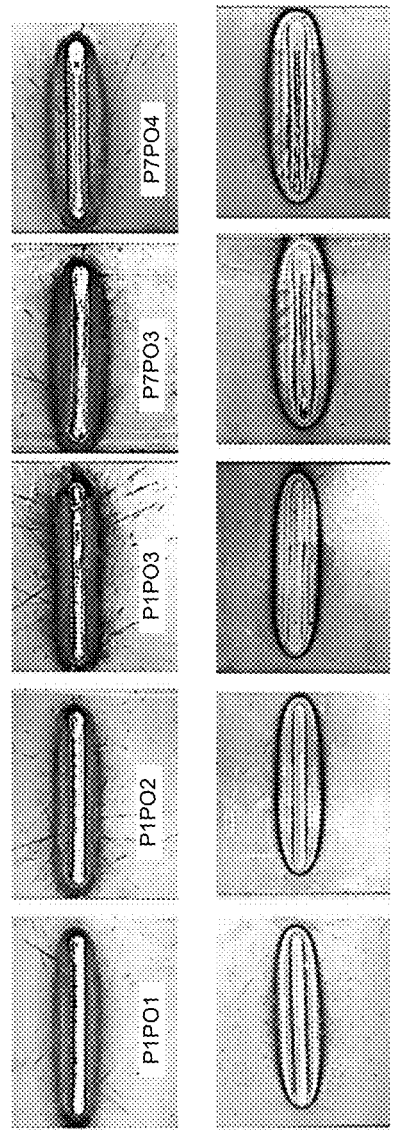
FIG. 17 illustrates the profile of weld line with porosity inclusion.

The criterion of categorization was specified associated with metallurgical observation and visual inspection. First, the visual inspection is conducted after a weld, which is considered the most effective and easy method of weld quality control. The weld line profile is the main concern. Different conditions, such as undersized weld, surface cracking, porosity, under fill, excessive root penetration and burn through, can also be identified, if they appear. The profiles of the weld line are shown in FIG. 16 and FIG. 17. The samples are roughly divided into two groups: without porosity and with porosity inclusion. With the increase of weld heat input, the width of weld line increases; while the porosity inclusion is expected to increase with reducing the shielding gas supply. The excessive penetration can be observed in P7 with the weld input of 0.58 KJ/mm. The burn-through hole happens when the heat input is 0.6 kJ/mm. For porosity samples, large amount of surface porosity can be found in P1PO3; but when the heat input is increased while fixing the gas flow rate, the surface porosity disappears, and excessive penetration can be observed.

Figure 18:
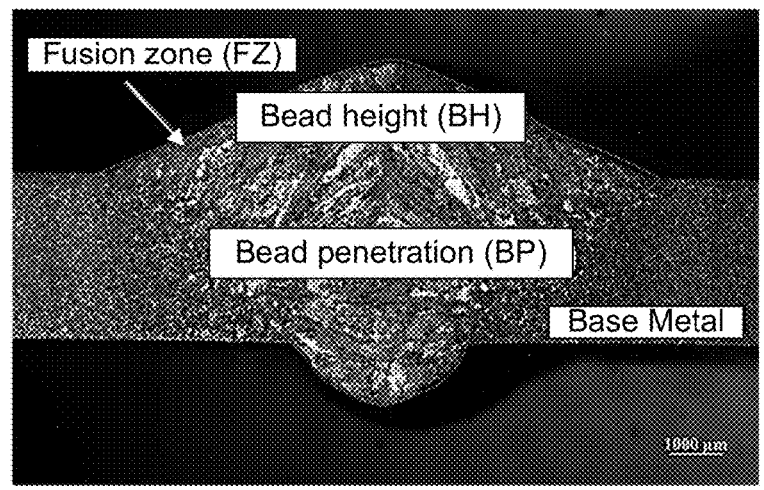
FIG. 18 illustrates the macrophotograph of the weld morphology in sample P7.

After visual inspection, the metallurgical observation was performed. The samples without porosity inclusions except the P8 are sectioned in the middle of weld line. FIG. 18 shows cross-sectional fusion zone (FZ) from P7. As shown in FIG. 18, the typical morphology of FZ in GMAW consists of bead height (BH) area, bead penetration (BP) area, burn-through. The detailed dimension was measured and summarized in Table 2. With increase of the weld heat input, the weld width, BP depth, and area of FZ increase simultaneously.

TABLE 2

The summary of FZ dimension

| sample name | Width (mm) | Bead penetration (BP) (mm) | Area of fusion zone (mm2) | weld heat input (kJ/mm) |
| --- | --- | --- | --- | --- |
| P4 | 5.96 | 0.83 | 7.14 | 0.18 |
| P3 | 6.54 | 0.89 | 9.01 | 0.20 |
| P2 | 7.70 | 1.14 | 13.01 | 0.30 |
| P1 | 8.67 | 1.66 | 17.65 | 0.38 |
| P5 | 9.27 | 3.56 | 26.54 | 0.49 |
| P6 | 10.25 | 3.54 | 25.07 | 0.58 |
| P7 | 9.84 | 4.22 | 31.38 | 0.60 |

To sum up, the criterion of classification in accordance with the principles herein can be determined mainly according to the penetration depth, weld heat input, and gas flow rate. Therefore, five different categories of weld are defined for machine learning algorithm accordingly: Good weld, Penetration, Burn-through, Porosity, and Porosity-Penetration. The classifications of samples are summarized in Table 3.

TABLE 3

The classification of samples

| Sample Group Name | Expected Quality |
| --- | --- |
| P1 | Good Weld |
| P2 | Good Weld |
| P3 | Good Weld |
| P4 | Good Weld |
| P5 | Penetration |
| P6 | Penetration |
| P7 | Onset of Burn-through |
| P8 | Burn-through |
| P1PO1 | Good Weld |
| P1PO2 | Porosity |
| P1PO3 | Porosity |
| P7PO3 | Porosity + Penetration |
| P7PO4 | Porosity + Penetration |
| P7PO5 | Porosity + Penetration |

Methodology of Machine Learning: Feature Extraction

Heat-input can be computed from input parameters using a suitable computation method, such as Eq (1):

$$\text{Heat input } (KJ/mm) = \frac{\text{Voltage (V)} \times \text{Amperage (A)} \times 60}{\text{Travel speed (mm/min)} \times 1000} \quad (1)$$

For acoustic emission, data can be collected from WD and R15 sensors. Suitable sensors can be selected based on the correlations of the time driven AE signals.

Figure 19:
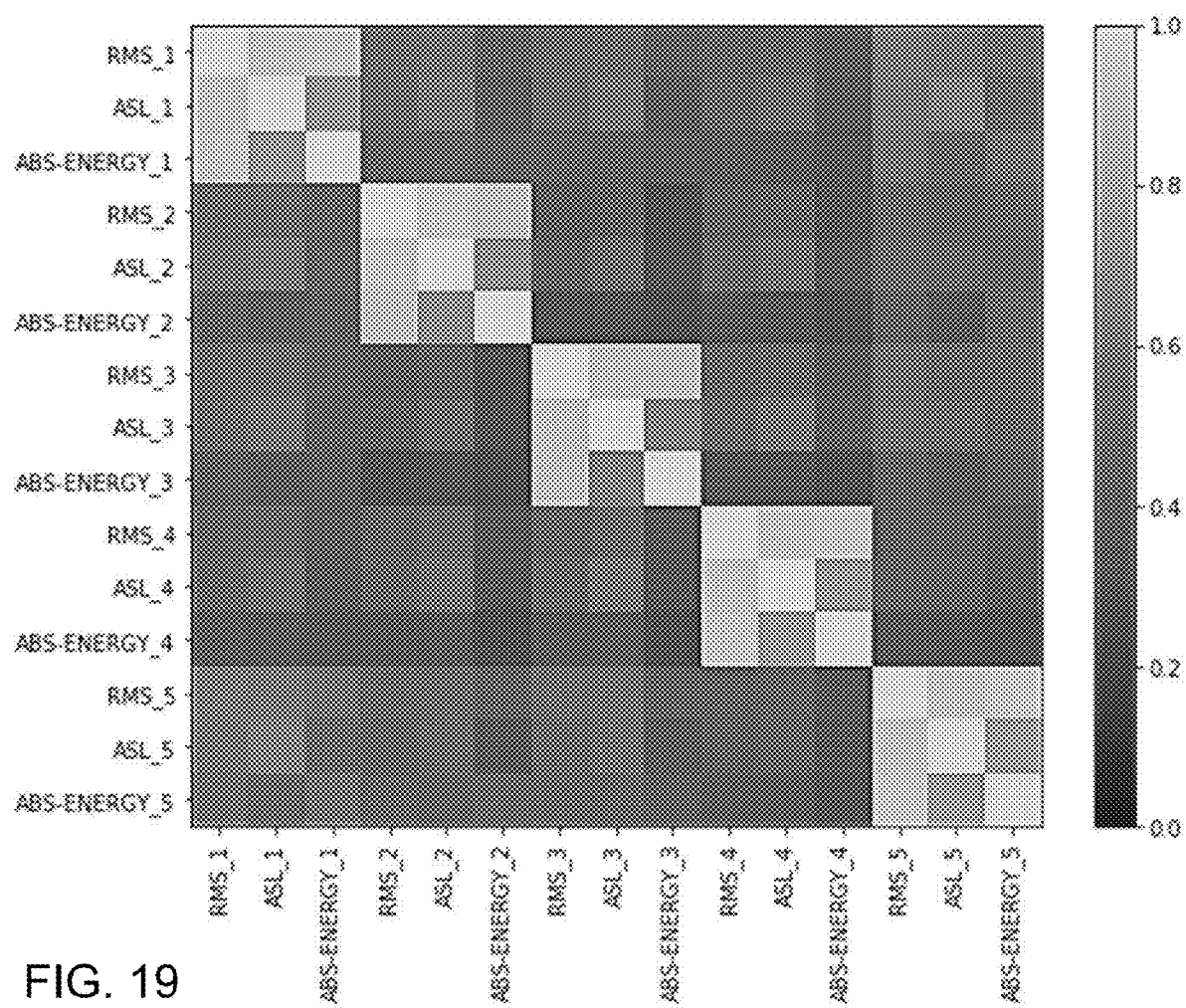
FIG. 19 illustrates the correlations of TDD channels.
Figures 20, 21:
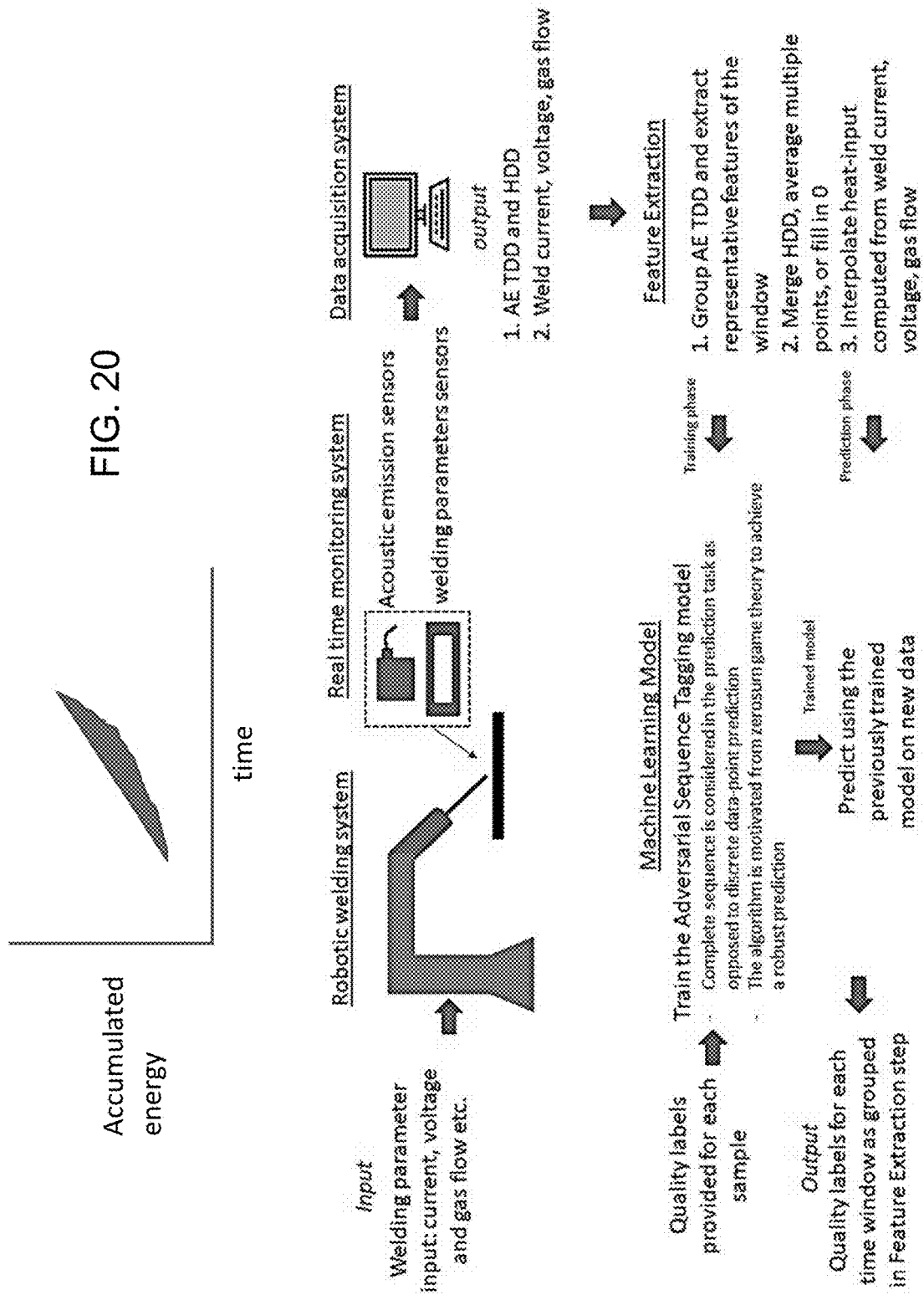
FIG. 20 illustrates accumulation rate.
FIG. 21 illustrates an example of a robotic welding process.
Figure 22:
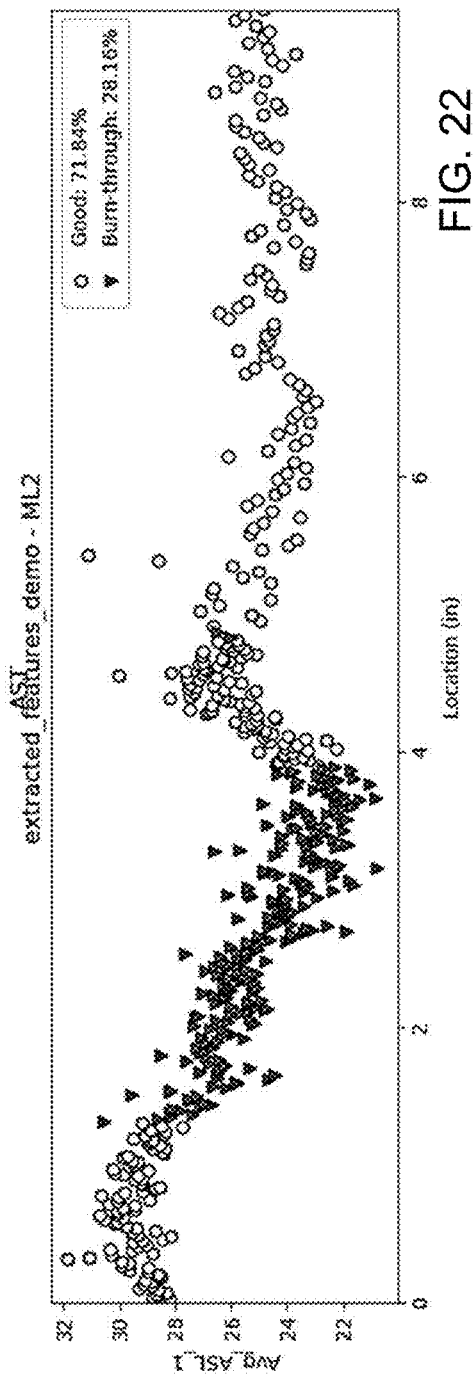
FIG. 22 illustrates a plot of extracted features.

From FIG. 19 it can be seen that channels 2 and 3 have fewer correlations, which are the WD and R15 sensors selected. Counts, amplitude, frequency centroid, and peak frequency are recorded as hit driven data (HDD) whenever signal crosses the specified threshold. Also, with 20 millisecond interval, absolute energy and average signal level (ASL) are recorded as time driven data (TDD), RMS is discarded as it has high correlation with the other two features. First, a smoothing can be performed for the TDD signals using a suitable method, such as a rolling-mean of window size 10. Then, each 200-millisecond time window can be quantized, and mean, minimum and maximum of the TDD features can be selected. Additionally, a suitable method can be applied to measure the data for rate of accumulation, such as by using the formula $\Sigma_{i=1}^{k} ix_i - i\mu_x$, where k the number of readings in the window (i.e. 10), x is the attribute (absolute energy or ASL), and $\mu_x$ is the corresponding attribute's average value. It captures the area shown in FIG. 20. Heat input is interpolated to match TDD times. HDD features are averaged from the ones fall into the respective 200 ms windows, with absence filled with 0.

Machine Learning

After selecting the features, they can be scaled into the [0, 1] range and a quadratic transformation can be performed. For training, one sample from P1, P4, P5, P6, and two samples from P8, P1PO3 and P7PO3 can be selected for their respective categories discussed above.

Two methods for prediction can be compared, one is Logistic Regression, and another is Adversarial Sequence Tagging. Let $X_t$ be the features extracted for time t, and $Y_t$ be the class label, then for a model f the prediction for each timestep t is made as:

$$Y_t = f(X_t)$$

In contrast, a sequence tagging model makes a prediction for the entire sequence as:

$$Y_{1:t} = f(X_{1:t})$$

Logistic Regression (LR) predicts each timestep individually by finding the maximum probability of a class:

$$Y_t = \underset{Y_t}{\operatorname{argmax}} \ P(Y_t = c|X_t; \theta), \quad P(Y_t = c|X_t; \theta) = \frac{e^{\theta_c \cdot X_t}}{\sum_{j=1}^{c} e^{\theta_j \cdot X_t}}$$

where $P(Y_t = c|X_t; \theta)$ is the probability of $Y_t$ having class c given the features $X_t$ and learned parameter $\theta$, and the parameter $\theta$ is learned by optimizing the following objective:

$$\min_{\theta} \left[ \sum_{j=1}^{c} (Y_i = j) \log P(Y_i = c|X_i; \theta) \right]$$

On the other hand, as a sequence tagging model, Adversarial Sequence Tagging (AST) can predict the full sequence utilizing a game-theoretic perspective:

$$Y_{1:t} = \underset{Y_{1:t}}{\operatorname{argmin}} \max_{P(Y'_{1:t}|X_{1:t})} E_{P(Y'_{1:t}|X_{1:t})} \left[ \sum_{k=1}^{t} (Y_k \neq Y'_k) + \psi(Y'_{1:t}, X_{1:t}) \right],$$

where $\psi_\theta(Y_{1:t}', X_{1:t}) = \Sigma_{k=1}^{t} \theta \cdot \phi(Y_k, X_k, Y_{k-1})$, is a potential term that motivates Y' to be similar to the training data, $\phi(Y_k, X_k, Y_{k-1})$ is the feature function corresponding to timestep k and previous timestep k−1. The parameter $\theta$ can be learned by the objective:

$$\min_{\theta} \min_{P(Y_{1:t}|X_{1:t})} \max_{P(Y'_{1:t}|X_{1:t})}$$

$$E_{P(Y_{1:t}|X_{1:t})P(Y'_{1:t}|X_{1:t})P(X_{1:t})} \left[ \sum_{k=1}^{t} (Y_k \neq Y'_k) + \psi_\theta(Y'_{1:t}, X_{1:t}) \right]$$

Results and Discussions

Table 4 shows the results of the prediction using the two exemplary models. Samples where the predictions 100% matched with the expected weld qualities were excluded. The samples are of lengths 31 (except P3), so 3.23% is only 1 data-point in the sequence.

TABLE 4

Results of AST and LR models.
Shown only non-complete correct classifications.

| | AST | | | | | LR | | | | |
|---|---|---|---|---|---|---|---|---|---|---|
| | G | Pn | B | Pr | Pr + Pn | G | Pn | B | Pr | Pn + Pr |
| P1-3 | 100 | 0 | 0 | 0 | 0 | 94.59 | 0 | 0 | 5.41 | 0 |
| P5-3 | 0 | 100 | 0 | 0 | 0 | 3.23 | 96.77 | 0 | 0 | 0 |
| P6-2 | 0 | 24.32 | 75.68 | 0 | 0 | 0 | 86.49 | 13.51 | 0 | 0 |
| P6-3 | 0 | 70.97 | 29.03 | 0 | 0 | 0 | 87.1 | 12.9 | 0 | 0 |
| P7-1 | 0 | 0 | 100 | 0 | 0 | 0 | 0 | 100 | 0 | 0 |
| P7-2 | 0 | 0 | 100 | 0 | 0 | 0 | 3.23 | 96.77 | 0 | 0 |
| P7-2 | 0 | 0 | 100 | 0 | 0 | 0 | 0 | 100 | 0 | 0 |
| P1PO1-1 | 100 | 0 | 0 | 0 | 0 | 91.89 | 0 | 0 | 8.11 | 0 |
| P1PO1-3 | 93.55 | 0 | 0 | 6.45 | 0 | 80.65 | 0 | 0 | 19.35 | 0 |
| P1PO2-1 | 0 | 0 | 0 | 100 | 0 | 3.23 | 0 | 0 | 96.77 | 0 |
| P1PO3-3 | 2.7 | 0 | 0 | 97.3 | 0 | 2.7 | 0 | 0 | 97.3 | 0 |
| P1PO3-4 | 0 | 0 | 0 | 100 | 0 | 3.23 | 0 | 0 | 96.77 | 0 |
| P1PO3-4 | 0 | 0 | 0 | 100 | 0 | 3.23 | 0 | 0 | 96.77 | 0 |
| P7PO5 | 0 | 0 | 3.23 | 0 | 96.77 | 0 | 0 | 0 | 0 | 100 |

Categories are abbreviated:
Good (G), Excessive Penetration (Pn), Burn-through (B), Porosity (Pr) and Porosity-Penetration (Pr + Pn).

As seen in table 4, although both models are able to predict weld qualities with high accuracies, AST is more consistent, especially in P1PO1 samples, which in analysis did not show any evidence of porosity. LR predicts one data point of the good weld P1-3 as porosity, which is not correct. LR partially predicts P7 as penetration, but those samples being "Onset of Burn-through", can be considered correct. The P7PO samples at the bottom of the table have minor porosity predictions, but since those are a subset of porosity-penetration, they can be considered correct as well. For P6 samples, both methods predict a mixture of excessive penetration and burn-through, though Logistic regression is more accurate to the expected quality.

A popular machine learning model for classification Gradient Boosting was also evaluated. But the prediction there are less consistent. For example, two P7 samples have 2.9% and 5.41% Porosity-Penetration as predicted, and 18.92% porosity in P1-3, but there should not be any porosity present in those samples. From these experiments, it was seen that considering the process as a sequence of events helps achieving a consistent prediction since during classification the system takes into account the adjacent points too, and thus avoids spurious signals that might have been present due to noise.

To check the effect of feature selection via correlation analysis, several tests were performed with discarding features having correlation coefficient above 0.9, 0.95 and 0.98. But from Table 5 it is seen that reducing this feature set does not perform better. Expected weld qualities are in bold letters, and only the samples where the predictions vary are shown.

TABLE 5

Compare feature selection based on correlations.

| | Predictions | P1-2 | P1-3 | P5-2 | P6-2 | P6-3 | P7PO4 |
|---|---|---|---|---|---|---|---|
| All features | G | 100 | 100 | 0 | 0 | 0 | 0 |
| | Pn | 0 | 0 | 100 | 24.32 | 70.92 | 0 |
| | B | 0 | 0 | 0 | 75.68 | 29.03 | 0 |
| | Pr | 0 | 0 | 0 | 0 | 0 | 0 |
| | Pr + Pn | 0 | 0 | 0 | 0 | 0 | 100 |
| Corr <0.98 | G | 97.3 | 94.59 | 0 | 0 | 0 | 0 |
| | Pn | 0 | 0 | 97.3 | 24.32 | 0 | 0 |
| | B | 0 | 0 | 2.7 | 75.68 | 100 | 29.73 |
| | Pr | 2.7 | 5.41 | 0 | 0 | 0 | 0 |
| | Pr + Pn | 0 | 0 | 0 | 0 | 0 | 70.27 |
| Corr <0.95 | G | 89.19 | 100 | 0 | 0 | 0 | 0 |
| | Pn | 0 | 0 | 100 | 0 | 0 | 0 |
| | B | 0 | 0 | 0 | 100 | 100 | 32.43 |
| | Pr | 18.81 | 0 | 0 | 0 | 0 | 0 |
| | Pr + Pn | 0 | 0 | 0 | 0 | 0 | 67.57 |
| Corr <0.90 | G | 72.97 | 62.16 | 0 | 0 | 0 | 0 |
| | Pn | 0 | 0 | 64.86 | 0 | 0 | 0 |
| | B | 0 | 0 | 35.14 | 100 | 100 | 0 |
| | Pr | 27.03 | 37.84 | 0 | 0 | 0 | 0 |
| | Pr + Pn | 0 | 0 | 0 | 0 | 0 | 100 |

| | Predictions | P7PO5 | P1PO1-3 | P1PO2-1 | P1PO3-3 | P1PO3-4 | P1PO3-5 |
|---|---|---|---|---|---|---|---|
| All features | G | 0 | 93.55 | 0 | 2.7 | 0 | 0 |
| | Pn | 3.23 | 0 | 0 | 0 | 0 | 0 |
| | B | 0 | 0 | 0 | 0 | 0 | 0 |
| | Pr | 0 | 6.45 | 100 | 97.3 | 100 | 100 |
| | Pr + Pn | 96.77 | 0 | 0 | 0 | 0 | 0 |
| Corr <0.98 | G | 0 | 100 | 48.39 | 2.7 | 0 | 0 |
| | Pn | 0 | 0 | 0 | 0 | 0 | 0 |
| | B | 0 | 0 | 0 | 0 | 0 | 0 |
| | Pr | 0 | 0 | 51.61 | 97.3 | 100 | 100 |
| | Pr + Pn | 100 | 0 | 0 | 0 | 0 | 0 |
| Corr <0.95 | G | 0 | 100 | 0 | 0 | 0 | 0 |
| | Pn | 0 | 0 | 0 | 0 | 0 | 0 |
| | B | 0 | 0 | 0 | 0 | 0 | 0 |
| | Pr | 0 | 0 | 100 | 100 | 100 | 96.77 |
| | Pr + Pn | 100 | 0 | 0 | 0 | 0 | 3.23 |
| Corr <0.90 | G | 0 | 100 | 3.23 | 2.7 | 3.23 | 3.23 |
| | Pn | 0 | 0 | 0 | 0 | 0 | 0 |
| | B | 0 | 0 | 0 | 0 | 0 | 0 |
| | Pr | 0 | 0 | 96.77 | 97.3 | 96.77 | 96.77 |
| | Pr + Pn | 100 | 0 | 0 | 0 | 0 | 0 |

A comparative study of using different kinds of features was also performed. Generally, input parameters have been used to monitor burn-through, or HDD features have been used to monitor defects including porosity. But combining all of them together increases the accuracy. As shown herein, the predictions using the logistic regression model as AST predictions are more diverse among samples of the same group. For succinct presentation, predictions are shown of one sample for each group from where a training sample was used, i.e. P1-1 was a training sample for good weld and so the prediction for P1-2 is shown. The expected weld quality is in bold letters.

TABLE 6

Prediction comparison of different feature sets.

| Features | Prediction | P1-2 | P4-2 | P5-2 | P6-2 | P8-3 | P1PO3-3 | P7PO3-3 |
|---|---|---|---|---|---|---|---|---|
| Heat Input | G | 2.7 | 100 | 0 | 0 | 0 | 0 | 2.7 |
|  | Pn | 0 | 0 | 100 | 100 | 0 | 0 | 0 |
|  | B | 0 | 0 | 0 | 0 | 100 | 0 | 0 |
|  | Pr | 97.3 | 0 | 0 | 0 | 0 | 100 | 0 |
|  | Pr + Pn | 0 | 0 | 0 | 0 | 0 | 0 | 100 |
| HDD | G | 8.11 | 75.68 | 5.41 | 0 | 0 | 0 | 13.51 |
|  | Pn | 21.62 | 2.7 | 8.11 | 18.92 | 22.58 | 0 | 18.92 |
|  | B | 10.81 | 13.51 | 16.22 | 29.73 | 64.52 | 0 | 5.41 |
|  | Pr | 45.95 | 5.41 | 70.27 | 51.35 | 9.68 | 83.78 | 2.7 |
|  | Pr + Pn | 13.51 | 2.7 | 0 | 0 | 3.23 | 16.22 | 59.46 |
| TDD | G | 2.7 | 97.3 | 94.59 | 0 | 3.23 | 2.7 | 0 |
|  | Pn | 0 | 0 | 0 | 0 | 0 | 0 | 0 |
|  | B | 97.3 | 0 | 5.41 | 100 | 96.77 | 2.7 | 0 |
|  | Pr | 0 | 2.7 | 0 | 0 | 0 | 0 | 0 |
|  | Pr + Pn | 0 | 0 | 0 | 0 | 0 | 94.59 | 100 |
| TDD + HDD + Heat Input | G | 100 | 100 | 0 | 0 | 0 | 2.7 | 0 |
|  | Pn | 0 | 0 | 100 | 86.49 | 0 | 0 | 0 |
|  | B | 0 | 0 | 0 | 13.51 | 100 | 0 | 0 |
|  | Pr | 0 | 0 | 0 | 0 | 0 | 97.3 | 0 |
|  | Pr + Pn | 0 | 0 | 0 | 0 | 0 | 0 | 100 |

From Table 6 it can be seen that although Heat Input alone predicts a lot of classes correctly, it cannot distinguish between P1 and P1PO3 samples since both has similar heat input (Table 2) and heat input is not enough to distinguish porosity. AE features (HDD and TDD) are able to identify porosity, but it does not perform well overall. Combining all three categories of features performs better. Although predictions of P6 samples shift to burn-though, they have more melting than P5 samples, and predicting heavy penetration as burn-though is less severe error than predicting good weld to other categories.

Thus, in accordance with the principles herein, an exemplary system can be configured to monitor and analyze acoustic emission (AE) signals along with input parameters and also use learned input analysis, such as a machine learning for real-time weld defect detection of different categories like good weld, burn-through, porosity, etc. From AE data, besides using traditional hit-driven data, new features can be computed to facilitate the learned input analysis, or machine learning models, learn better. Also, it is shown that considering the prediction method as a sequence tagging task, where the predictor considers neighbors along with its own features, tends to perform better than traditional methods of predicting each data-point as its own. With the small training sample (only two samples per defect category), this result is promising. More data can make the learned input analysis, or machine learning methods, more robust and the automated weld defect detection system more accurate.

Additional Description

Adversarial Sequence Tagging

Adversarial prediction models herein can be extended to sequence tagging tasks for any suitable system, including weld quality monitoring.

Formulation

For sequence tagging, the predictor predicts a probability for each of the sequence variables, $\hat{P}(\hat{y}|x)$, against the adversarial distribution $\check{P}(\check{y}|x)$. The optimization problem is similar to single-variate problem:

$$\min_{\hat{P}(\hat{y}|x)} \max_{\check{P}(\check{y}|x)} \mathbb{E}_{P(x)\hat{P}(\hat{y}|x)\check{P}(\check{y}|x)}\left[\sum_{t=1}^{T} C_{\check{Y}_t, \hat{Y}_t}\right] \quad (3.11)$$

such that: $\mathbb{E}_{\hat{P}(x)\check{P}(\check{y}|x)}[\Phi(X, \check{Y})] = \mathbb{E}_{\hat{P}(x,y)}[\Phi(X, Y)]$, where the feature functions, $\Phi(x, y)$, can be decomposed over pairs of the $Y_1, \ldots, Y_T$ variables: e.g., $\Phi(x, y) = \sum_{t=1}^{T-1} \phi(x, y_t, y_{t+1})$.

Using Lagrangian and zero-sum game duality Equation 3.11 reduces to a convex optimization problem:

$$\min_{\theta} \mathbb{E}_{\hat{P}(x,y)}\left[\max_{\check{p}x} \min_{\hat{p}x} \hat{p}_X^T C'_{X,\theta} \check{p}x\right], \quad (3.12)$$

where $\hat{p}_X = \hat{P}(\hat{y}|x)$ and $\check{p}_X = \check{P}(\check{y}|x)$, and $C_{X,\theta}'$ is a payoff matrix for the zero-sum game that incorporates both the loss function and a Lagrangian potential term that enforces the optimization's constraints: $(C_{x,y,\theta}')_{\check{y},\hat{y}} = \text{loss}(\hat{y}, \check{y}) + \theta \cdot (\phi(x, \check{y}) - \phi(x, y))$.

The 0-1 loss, which has been performed, is a special case of cost-sensitive sequence tagging. A payoff matrix will have the Hamming loss and a Lagrangian potential for each cell. Table A shows a 3-length binary-valued sequence game.

TABLE A: The payoff matrix $C_{x,\theta}'$ for a game over the length three binary-valued chain of variables between player $\check{Y}$ choosing a distribution over columns and $\hat{Y}$ choosing a distribution over rows. Lagrangian potentials are compactly represented as: $\psi_{\check{y}_1\check{y}_2\check{y}_3} = \theta \cdot (\Phi(\check{y}, x) - \Phi(y, x))$.

TABLE A

|     | 000 | 001 | 010 | 011 |
| --- | --- | --- | --- | --- |
| 000 | $0 + \psi_{000}$ | $1 + \psi_{001}$ | $1 + \psi_{010}$ | $2 + \psi_{011}$ |
| 001 | $1 + \psi_{000}$ | $0 + \psi_{001}$ | $2 + \psi_{010}$ | $1 + \psi_{011}$ |
| 010 | $1 + \psi_{000}$ | $2 + \psi_{001}$ | $0 + \psi_{010}$ | $1 + \psi_{011}$ |
| 011 | $2 + \psi_{000}$ | $1 + \psi_{001}$ | $1 + \psi_{010}$ | $0 + \psi_{011}$ |
| 100 | $1 + \psi_{000}$ | $2 + \psi_{001}$ | $2 + \psi_{010}$ | $3 + \psi_{011}$ |
| 101 | $2 + \psi_{000}$ | $1 + \psi_{001}$ | $3 + \psi_{010}$ | $2 + \psi_{011}$ |
| 110 | $2 + \psi_{000}$ | $3 + \psi_{001}$ | $1 + \psi_{010}$ | $2 + \psi_{011}$ |
| 111 | $3 + \psi_{000}$ | $2 + \psi_{001}$ | $2 + \psi_{010}$ | $1 + \psi_{011}$ |

|     | 100 | 101 | 110 | 111 |
| --- | --- | --- | --- | --- |
| 000 | $1 + \psi_{100}$ | $2 + \psi_{101}$ | $2 + \psi_{110}$ | $3 + \psi_{111}$ |
| 001 | $2 + \psi_{100}$ | $1 + \psi_{101}$ | $3 + \psi_{110}$ | $2 + \psi_{111}$ |
| 010 | $2 + \psi_{100}$ | $3 + \psi_{101}$ | $1 + \psi_{110}$ | $2 + \psi_{111}$ |
| 011 | $3 + \psi_{100}$ | $2 + \psi_{101}$ | $2 + \psi_{110}$ | $1 + \psi_{111}$ |
| 100 | $0 + \psi_{100}$ | $1 + \psi_{101}$ | $1 + \psi_{110}$ | $2 + \psi_{111}$ |
| 101 | $1 + \psi_{100}$ | $0 + \psi_{101}$ | $2 + \psi_{110}$ | $1 + \psi_{111}$ |
| 110 | $1 + \psi_{100}$ | $2 + \psi_{101}$ | $0 + \psi_{110}$ | $1 + \psi_{111}$ |
| 111 | $2 + \psi_{100}$ | $1 + \psi_{101}$ | $1 + \psi_{110}$ | $0 + \psi_{111}$ |

As with the classification problem, these games can be solved using linear programming to find each player's mixed Nash equilibrium. The mixed Nash equilibrium strategy for the adversarial player is obtained from:

$$\max_{\hat{p} \geq 0, v} v \quad (3.13)$$

such that: $v \leq C'_{\hat{y},*} \hat{p} \forall \hat{y} \in y$ $1^T p = 1$.

Similarly, the predictor's mixed Nash equilibrium strategy is:

$$\min_{\check{p} \geq 0, v} v \quad (3.14)$$

such that: $v \geq p^T C'_{*,\check{y}} \forall \check{y} \in y$ $1^T \check{p} = 1$.

However, solving these matrix games directly using the method of adversarial classification becomes intractable as for each player we now have $|\mathcal{Y}|^T$ choices in the game matrix $C_{x,\theta}'$.

Double Oracle Method for Efficient Prediction

To reduce the computational cost of solving the entire adversarial game, the double oracle algorithm can be employed. It constructs the game matrix iteratively until finding the correct equilibrium. It starts with a subset of pure strategies, $\hat{S}$ and $S_r$, for each player. It constructs the payoff matrix and solves for the Nash Equilibrium for this set of strategies.

Using the mixed strategies of the equilibrium, $\hat{P}(\hat{y}|x)$ or $\check{P}(\check{y}|x)$, it then finds the best response pure strategy for the other player $\check{y}_{BR}$ or $\hat{y}_{BR}$. The algorithm terminates when neither of the players can improve by adding anymore best responses. The best response pure strategy $\check{y}_{BR}$ is computed using:

$$\max_{\check{y}_{1:T}} \mathbb{E}_{\hat{P}(\hat{y}_{1:T}|x)}\left[\sum_{t=1}^{T} I(\hat{Y}_t \neq \check{y}_t)\right] + \sum_{t=1}^{t-1} \theta \cdot \phi(x, \check{y}_{t:t+1}) = \max_{\check{y}_1} \quad (3.15)$$

$$\left(\mathbb{E}_{P(\hat{y}_1|x)}[I(\hat{Y}_1 \neq \check{y}_1)] + \max_{\check{y}_2}\left(\theta \cdot \phi(x, \check{y}_{1,2}) + \mathbb{E}_{P(\hat{y}_2|x)}[I(\hat{Y}_2 \neq \check{y}_2)] + \max_{\check{y}_3}\right.\right.$$

$$\left.\left.\left(\theta \cdot \phi(x, \check{y}_{2,3}) + \ldots + \max_{\check{y}_r} \theta \cdot \phi(x, \check{y}_{T-1:T}) + \mathbb{E}_{P[\hat{y}_T|x]}[I(\hat{Y}_T \neq \check{y}_T)]\right)\right)\right),$$

Best response $\hat{y}_{BR}$ is computed similarly using $\check{P}(\check{y}|x)$ distribution and finding the minimum expected loss.

Single Oracle Method for Efficient Prediction (Based on Previous Work)

Unlike adversarial prediction methods for structured losses, the sequence tagging loss can be additively decomposed into payoff matrix terms $C_t$ for $t \in \{1, \ldots, T\}$. This allows all of estimator's "pure strategies" to be considers using the following pair of linear programs:

(3.16)

$$\min_{\hat{p}_1, \hat{p}_2, \ldots, \hat{p}_T, v} v \text{ such that: } p_t \geq 0 \text{ and } 1^T p_t = 1, \quad (1)$$

$$\forall t; \text{ and } v \geq \theta^T \phi(x, \check{y}) + \sum_{t=1}^{T} \hat{p}_t^T [C_t]_{*,\check{y}} \check{y} \in \tilde{S};$$

(3.17)

$$\max_{\check{p} \geq 0, v_1, v_2, \ldots, v_T} \theta^T \Phi_{x,y} \check{p} + \sum_{t=1}^{T} v_t \text{ such that: } 1^T \check{p} = \quad (2)$$

$1$ and $v_t \leq [C_t]\hat{y}, *\check{p} \forall t, \hat{y} \in y;$

As the entire set of predictor pure strategies is considered, the oracle now only needs to iteratively expand the adversary's set of strategy and becomes single oracle as in Algorithm 1.

---

Algorithm 1
Single Oracle Game Solver

---

Require: Lagrangian potential, $\psi$; initial action set $\check{S}$
Ensure: $[\hat{P}(\hat{y}|x), \check{P}(\check{y}|x)]$
    $\check{y}_{BR} \leftarrow \{\}$
    repeat
        $C_t \leftarrow$ buildPayoffMatrices($\check{S}, \psi$)
        $[\hat{P}(\hat{y}|x), v_{Nash_1}] \leftarrow$ solveZeroSumGame$_{\hat{y}}$(C)
        $[\check{y}_{BR}, v_{BR}] \leftarrow$ findBestResponseStrategy($\hat{P}(\hat{y}|x), \psi$)

Algorithm 1
Single Oracle Game Solver $\check{S} \leftarrow \check{S} \cup \check{y}_{BR_\vee}$
until $(v_{Nash_1}) = v_{BR})$
return $[\hat{P}(\hat{y}|x), \check{P}(\check{y}|x)]$

---

The size of the payoff matrix, C' from Equation 3.13, in the double oracle method is $\mathcal{O}(|\hat{S}||\check{S}|)$, and in the single oracle method it is $\mathcal{O}(|\hat{S}||T||\mathcal{Y}|)$. So single oracle is efficient when the size of pure strategies is sufficiently large in the double oracle method. Then the added complexity of the linear program of the single oracle is compensated by the size reduction of the double oracle's payoff matrix.

A New Approach: Solving Game in Terms of Pair-Wise Marginal Probabilities

In accordance with the principles herein, finding the equilibrium in Single Oracle is still an iterative process, there the search space for the adversary's mixed strategy is $|\mathcal{Y}|^T$. Since the objective can be additively decomposed, as when finding the best response in the Oracle methods, as well as in the adversary objective in the Single Oracle method, we can formulate the objective that further decouples the adversary's distribution from the full structure in Equation 3.17 to each node separately. For each edge connecting two adjacent nodes, we have a pairwise marginal probability $\check{P}(\check{y}_t, \check{y}_{t+1}|x_t, x_{t+1})$. The game value at each node $t$ depends only on the marginals corresponding the $t$, $\check{P}(\check{y}_t, \check{y}_{t+1}|x_t, x_{t+1})$ or $\check{P}(\check{y}_{t-1}, \check{y}_t|x_{t-1}, x_t)$. The maximizer linear program then can be written in terms of the $\check{P}(\check{y}_t, \check{y}_{t+1}|x_t, x_{t+1})$ with an additional constraint ensuring $\Sigma_{\check{y}_{t+1}}\check{P}(\check{y}_t, \check{y}_{t+1}|x_t, x_{t+1}) = \Sigma_{\check{y}_{t-1}}\check{P}(\check{y}_{t-1}, \check{y}_t|x_{t-1}, x_t)$.

$$\max_{\substack{p_{12}, p_{23}, \ldots, p_{T-1,T}\\v_1, v_2, \ldots, v_T}} \sum_{t=1}^{T} v_t \text{ such that: } v_t \leq C_{\check{y}_t,*} \check{p}_{t-1,t} \quad (3.18)$$

$$\forall \hat{y}_t \in \mathcal{Y} \forall t \in \{2, \ldots, T\} v_1 \leq C_{y_1,*} \check{p}_{1,2} \forall \hat{y}_1 \in \mathcal{Y} \sum_{\check{y}_{t-1}} \check{p}_{t-1,t} =$$

$$\sum_{\check{y}_{t+1}} \check{p}_{t,t+1} \forall t \in \{2, \ldots, T-1\} 1^T \check{p}_{t-1,t} = 1. \forall t \in \{2, \ldots, T\}$$

Figure 23:
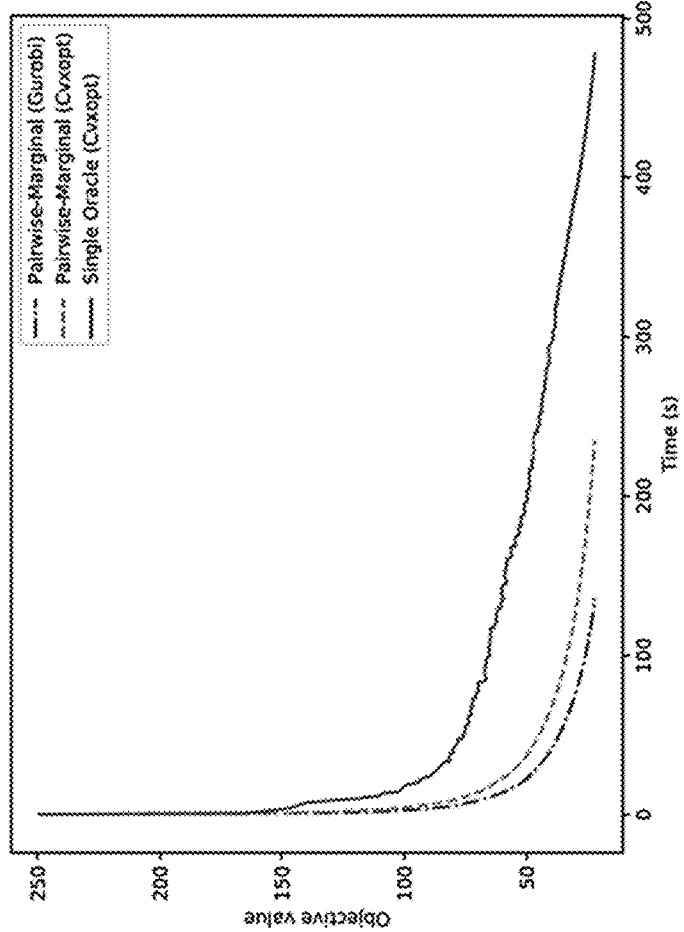
FIG. 23 illustrates a comparison of convergence speed of Single Oracle and Pairwise-marginal method.

The number of variables is $\mathcal{O}(|\mathcal{Y}|^2 T)$ since there are $|\mathcal{Y}|^2$ pairwise-marginals for each node. This is much less than the worst-case size in Single Oracle $|\check{S}|=|\mathcal{Y}|^T$ and does not require the Algorithm 1 to iteratively search for the equilibrium. For a dataset with four classes and about sequences of length 31, FIG. 23 shows the convergence speed of the new pairwise-marginal process compared to the previous Single Oracle process.

We have used Gurobi (Gurobi Optimization, 2015) at first and Cvxopt (Andersen et al. 2019) only have been used to implement the Single Oracle in Python. For comparison, we show the speed or pairwise-marginal implemented in Cvxopt as well, which shows that for the dataset mentioned above, pairwise-marginal method is twice as fast. Also, noticeable is the time spent by the Single Oracle for iterative search of the equilibria by horizontal plateaus in the corresponding step-like plot.

Learning Via Convex Optimization

The difference of the feature expectation provides the gradient. The feature expectation of the sequence samples is computed using the following equation:

$$\mathbb{E}_{\check{P}(\check{y}|x)}[\Phi(x, \check{Y})] = \mathbb{E}_{\check{P}(\check{y}|x)}\left[\sum_{t=1}^{T-1} \Phi(x, \check{y}_t, \check{y}_{t+1})\right] = \quad (3.19)$$

$$\sum_{t=1}^{T-1} \sum_{y,y'} \check{P}(\check{Y}_t = y', \check{Y}_{t+1} = y|x, \theta)\Phi(x, \check{y}_t, \check{y}_{t+1}).$$

Algorithm 2 can then be used to obtain the model parameters using stochastic gradient descent.

Algorithm 2: Stochastic Gradient Descent.

---

Algorithm 1
Parameter estimation for the robust cost-sensitive classifier

Require: Cost matrix C, training dataset $\mathcal{D}$ with pairs $(\hat{x}_i, \hat{y}_i) \in \mathcal{D}$, feature function $\phi$:
$x \times y \to \mathbb{R}^k$, time-varying learning rate $\{\gamma_t\}$
Ensure: Model parameter estimate $\theta$
  $t \leftarrow 1$
  while $\theta$ not converged do
    for all $(\hat{x}_i, \hat{y}_i) \in \mathcal{D}$ do
      Construct cost matrix $C_{\hat{x}_i,\theta}$
      Solve for $\check{P}(\check{y}|\hat{x}_i)$ using the LP
      $\nabla_\theta = \mathbb{E}_{\check{P}(\check{y}|\hat{x}_i)}[\Phi(\hat{x}_i, \check{Y})] - \Phi(\hat{x}_i, \hat{y}_i)$
      $\theta = \theta - \gamma_t \nabla_\theta$
      $t \leftarrow t + 1$
    end for
  end while In accordance with the principles herein, exemplary systems can be configured to process at least two separate operational components data and then synchronizing the at least two data sets using a suitable synchronization step or script. For example, in a weld process Heat Input can be synchronized with the Time Driven AE (TDD) data to form sync data. The main learned input, or machine learning part of the data processing methods for informing a prediction in real-time based on a learned input requires this sync data (and optionally Hit Driven AE, HDD) in csv files.

Synchronization

The synchronization script can synchronize the Heat Input with the TDD data in an exemplary weld monitoring process.

Figure 24:
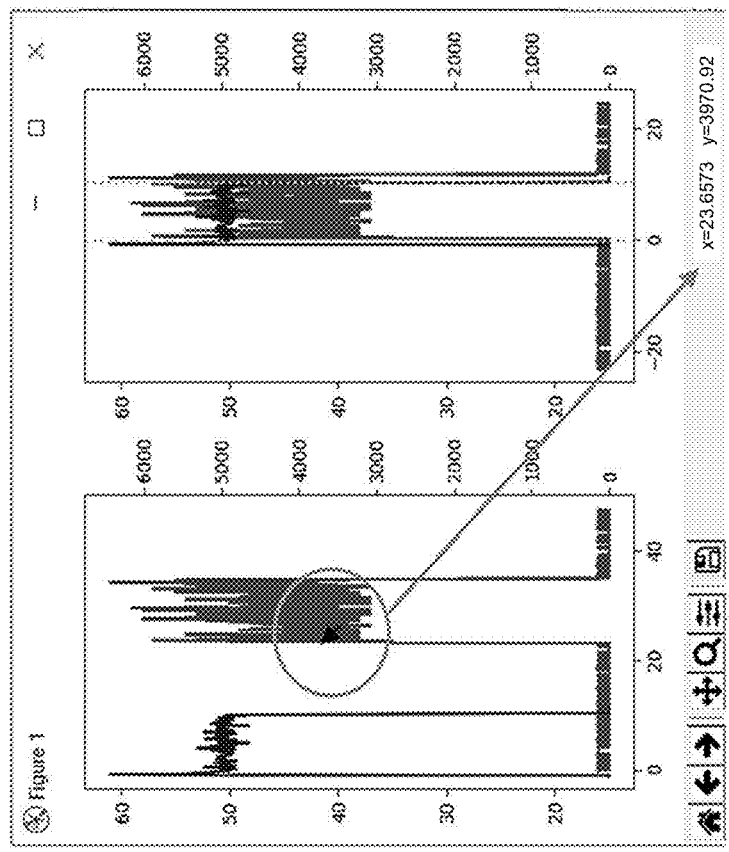
FIG. 24 illustrates an example of a time-offset.

As illustrated in FIG. 24, a cursor can hover on the red graph's jump, which shows the time-offset from the x axis. Exemplary systems can be configured to allow a user of the system to manually Enter 'n' in the "Agree with adjusted time" prompt, then enter the noted offset in response to a Enter offset prompt. Alternatively, offsets can be configured to adjust automatically based on a learned input, for example.

Machine Learning Input or Model

A model can be pre-trained or continually trained in order to inform the prediction model for a given manufacturing process. Once model is trained, the system can provide predictive input into the quality determination for samples in the same format as training samples.

Figure 25:
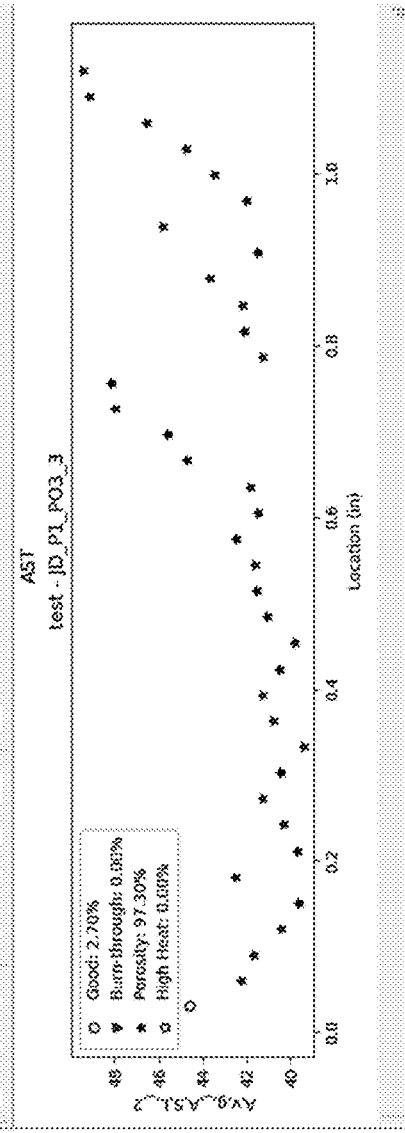
FIG. 25 illustrates for run-time prediction use the predict_demo.py script, which requires all the process features, including both the sync_data features and HDD features in single file named processed_features.csv. It repeated loads the file and shows the prediction.

Prediction:

In accordance with the principles herein, samples can be evaluated separately during the weld process to provide a continual real-time quality control for the process. For example, for each prediction the system can call the sample data and then the model data. A prediction analysis step can then be performed and can provide a visual prediction output, such as shown in FIG. 25. The visual prediction output can then be stored with the system data relating to the manufacturing process run, if desired.

In exemplary embodiments run-time prediction analysis can require all the process features, including both the sync_data features and HDD features in a single file. The single file repeated loads the file and shows the prediction.

Manufacturing data of the system can be correlated and analyzed to improve the efficiency of related manufacturing processes, if desired. In some embodiments, multiple manufacturing predictions can be displayed, and notifications, such as sound, display or other feedback, can inform a process operator in real-time during the manufacturing process.

In accordance with the principles herein, embodiments of the system for monitoring the manufacturing process quality control can be improved by generating acoustic emission data using a suitable sensor array. For example, a MEMS transducer/sensor array tuned for Acoustic Emission sensing and designed for the non-destructive detection of structural flaws without noise cancellation and via a single channel can be incorporated into the system, if desired. Where the process moves along a path, acoustic emission sensors adapted to provide data outputs using wireless technology can be incorporated. Operability of the frequency range for the sensors can vary widely, such as from 30 KHz to 2 MHz, for example. Noncontact air coupled sensors can be particularly useful for these quality monitoring type of applications.

Figure 26:
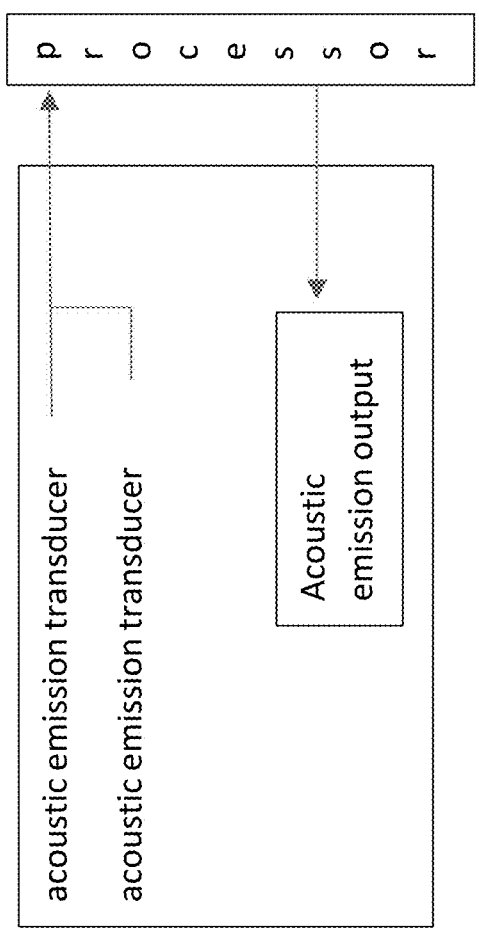
FIG. 26 illustrates providing acoustic data from the transducers to the system to provide an acoustic emission output.

As illustrated in FIG. 26, acoustic emission sensors or transducers can provide an output to the system using a single channel, if desired. Data from the transducers can undergo the analysis of the system to provide an acoustic emission output that includes the predictive information in the analysis. Real-time control of the welding process can then be achieved.

Figure 27:
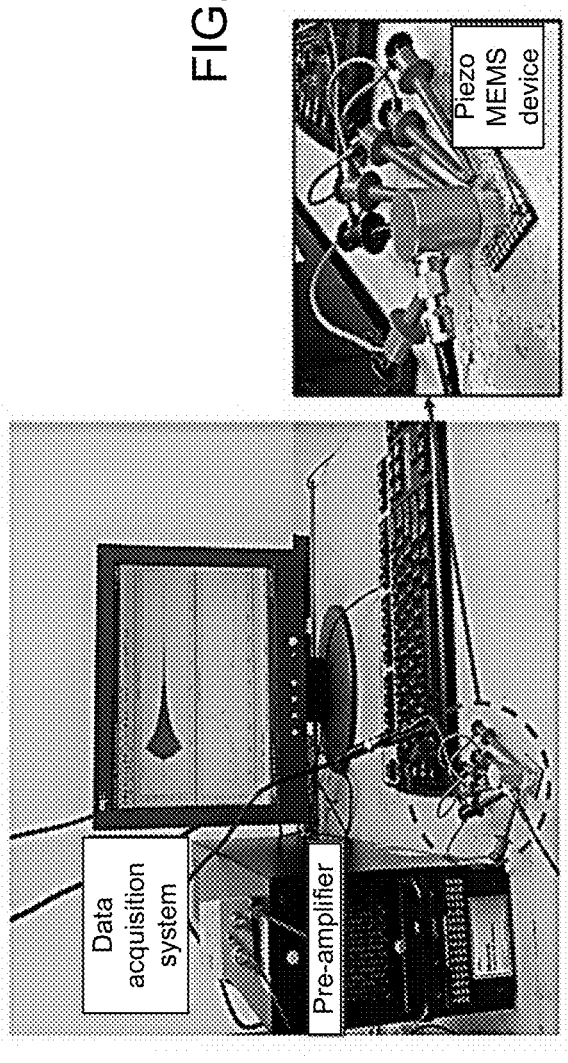
FIG. 27 illustrates an experimental setup for joined MEMS sensors with two different frequencies.

As illustrated in FIG. 27, the system can join transducers with different frequencies to improve the precision of the system.

As illustrated in FIGS. 28A and 28B, the transducers can be suitably designed to improve the acoustic emission data precision.

Figure 30:
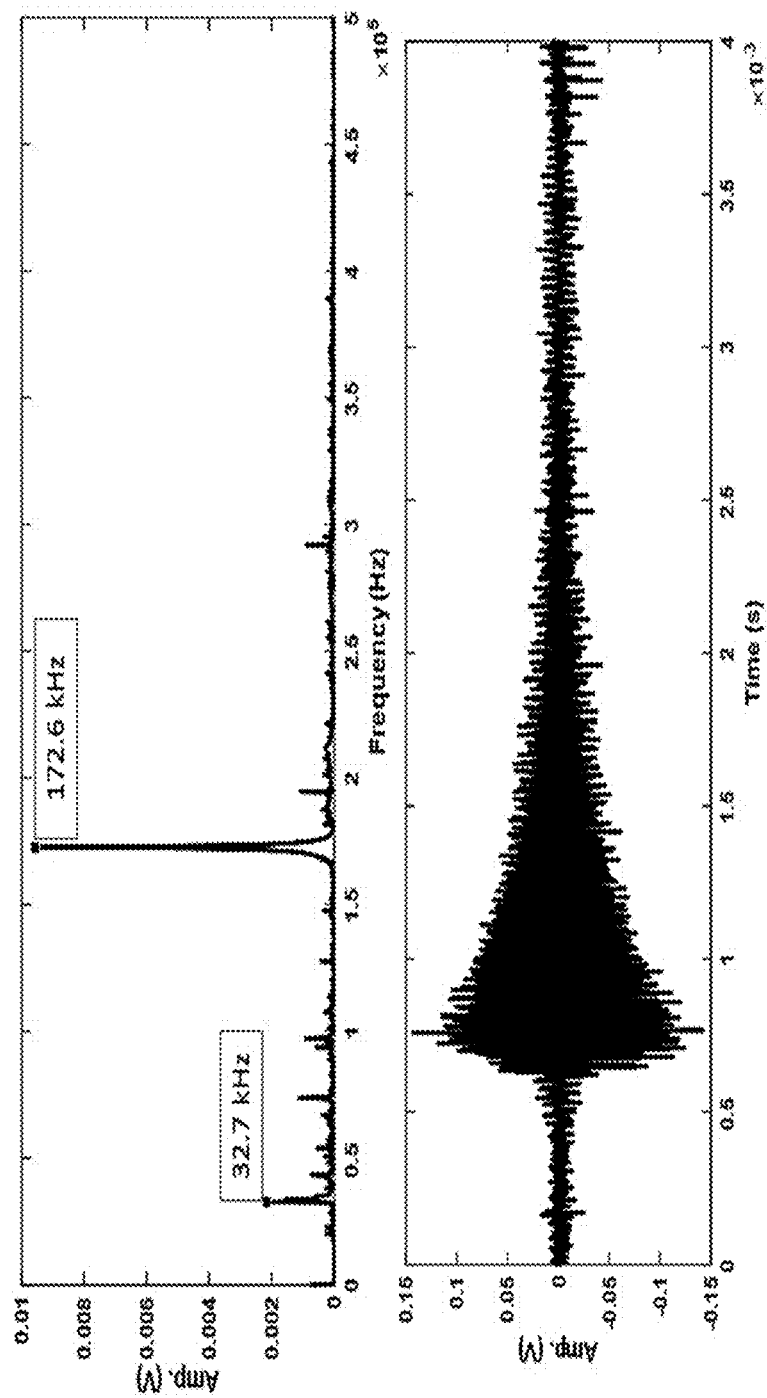
FIG. 30 illustrates a response of serially connected mode of the 40 kHz and 200 kHz sensors.

FIGS. 29A-29B and 30 illustrate individual and collective responses, respectively, of serially connected transducers. Systems configured in accordance with the principles and methods herein aim to reducing defects in manufacturing processes, such as welding, and increasing efficiency of manufacturing through optimization of the welding system. Further, systems designed in accordance with the principles herein can provide not only real-time monitoring of manufacturing quality parameters, but also control to halt a process when a defect is determined.

Although a number of exemplary embodiments are provided herein, the principles of the disclosure can extend to any quality control manufacturing process where sensor data can be analyzed and monitored in real-time in accordance with the principles herein.

Systems constructed in accordance with the principles herein can include Real-time Assessment of Weld Quality. Systems can incorporate non-contact Acoustic Emission components and/or Machine Learning capabilities, if desired. Current weld evaluation processes are usually conducted in the post-weld stage. In this way, defects are found after the weld is completed, often resulting in disposal of the expensive material or lengthy repair processes. Simultaneously, weld quality inspections tend to be performed manually by a human, even for an automated weld. Therefore, a proper real-time weld quality monitoring method associated with a decision-making strategy is needed to increase the productivity and automaticity in weld. In this study, acoustic emission (AE) as a real-time monitoring method is introduced for gas metal arc weld (GMAW). Several types of AE sensors (R6, WD, R15 and R1.5) are used to cover all possible frequency ranges from 5 kHz to 400 kHz. Additionally, the welding parameters (weld current, voltage, gas flow rate and heat input) are also recorded during the welding process. Different types of weld are artificially created to generate different signals. For the automated decision-making system, machine learning algorithms are used. Several features extracted from the AE and welding parameter monitoring system feed into a machine learning algorithm. For decision-making, we train supervised learning models and evaluate their performances on unseen data. General classification methods—such as Logistic Regression—predict each data-point separately. In this work, we explore the prediction task as a sequence tagging problem. A novel machine learning method for sequence tagging was developed in this work accordingly. We compare these models and present the analyses of the automated welding quality prediction system.

It should be noted that the inventive principles and concepts have been described with reference to representative embodiments, but that the inventive principles and concepts are not limited to the representative embodiments described herein. Although the inventive principles and concepts have been illustrated and described in detail in the drawings and in the foregoing description, such illustration and description are to be considered illustrative or exemplary and not restrictive; the invention is not limited to the disclosed embodiments. Other variations to the disclosed embodiments can be understood and effected by those skilled in the art, from a study of the drawings, the disclosure, and the appended claims.

What is claimed is:

1. A microelectromechanical systems (MEMS) acoustic emissions (AE) transducer system comprising:
   at least first and second MEMS AE transducers integrated together in a chip, the first and second MEMS AE transducers operating over at least first and second frequency ranges, respectively, that are separate from one another, the first and second MEMS AE transducers generating first and second electrical responses in response to receiving acoustic emissions in the first and second frequency ranges, respectively, the first and second electrical responses being output from the chip, where the first and second electrical responses are continuously electrically combined to generate a combined electrical response on the chip.

2. The MEMS AE transducer system of claim 1, wherein the combined electrical response is output from the chip over a single electrical channel of the MEMS AE transducer system.

3. The MEMS AE transducer system of claim 2, wherein the first and second MEMS AE transducers are electrically coupled together in series to generate the combined electrical response prior to being output from the chip on the single electrical channel.

4. The MEMS AE transducer system of claim 2, further comprising:
   a data acquisition system in communication with the chip, the data acquisition system receiving the combined electrical response output on the single channel, the data acquisition system being configured to perform a signal processing algorithm that processes the combined electrical response to extract the first and second electrical responses from the combined electrical response.

5. The MEMS AE transducer system of claim 1, wherein the first and second MEMS AE transducers are tuned to the first and second frequency ranges, respectively, by fabricating the first and second MEMS AE transducers according to first and second sets of design parameters, respectively.

6. The MEMS AE transducer system of claim 5, wherein the first and second MEMS AE transducers each comprise:
   one or more electrically-conductive semiconductor layers comprising a first electrode;
   one or more metal layers comprising a second electrode; and
   one or more piezoelectric layers disposed in between and in contact with the first electrode and the second electrode.

7. The MEMS AE transducer system of claim 6, wherein said one or more electrically-conductive semiconductor layers comprise one or more layers of N-doped silicon and wherein said one or more piezoelectric layers comprise one or more layers of aluminum nitride.

8. The MEMS AE transducer system of claim 6, wherein at least one of the first and second MEMS AE transducers has a four-beam design, each beam being formed in said one or more electrically-conductive semiconductor layers, each beam having a first end that is coupled to a central disk-shaped portion of said one or more electrically-conductive semiconductor layers and a second end that extends away from the first end and is coupled to an outer portion of said one or more electrically-conductive semiconductor layers.

9. The MEMS AE transducer system of claim 6, wherein at least one of the first and second MEMS AE transducers has a diaphragm design, a diaphragm portion of said one or more electrically-conductive semiconductor layers comprising the first electrode of the at least one MEMS AE transducer, said one or more piezoelectric layers of piezoelectric material being disposed on top of the diaphragm portion, said one or more metal layers being disposed on top of said one or more piezoelectric layers of piezoelectric material to form a top electrode of the at least one MEMS AE transducer on top of the diaphragm portion, said one or more piezoelectric layers of piezoelectric material being clamped about its circumference by the diaphragm portion of said one or more electrically-conductive semiconductor layers.

10. The MEMS AE transducer system of claim 6, wherein the first MEMS AE transducer has a four-beam design and the second MEMS AE transducer has a diaphragm design, each beam of the first MEMS AE transducer being formed in said one or more electrically-conductive semiconductor layers, each beam having a first end that is coupled to a central disk-shaped portion of said one or more electrically-conductive semiconductor layers of the first MEMS AE transducer and a second end that extends away from the first end and is coupled to an outer portion of said one or more electrically-conductive semiconductor layers of the first MEMS AE transducer, wherein a diaphragm portion of the second MEMS AE transducer is formed in said one or more electrically-conductive semiconductor layers and comprises the first electrode of the second MEMS AE transducer, said one or more piezoelectric layers of piezoelectric material of the second MEMS AE transducer being disposed on top of the diaphragm portion, said one or more metal layers of the second MEMS AE transducer being disposed on top of said one or more piezoelectric layers of piezoelectric material of the second MEMS AE transducer to form a top electrode of the second MEMS AE transducer on top of the diaphragm portion, said one or more piezoelectric layers of piezoelectric material of the second MEMS AE transducer being clamped about a circumference of the said one or more piezoelectric layers of piezoelectric material by said one or more electrically-conductive semiconductor layers.

11. The MEMS AE transducer system of claim 2, wherein a highest frequency of the first frequency range is lower than a lowest frequency of the second frequency range, and wherein a center frequency of the second frequency range is not a multiple of a center frequency of the first frequency range to ensure that the first and second electrical responses combine constructively when combined into the combined electrical response.

12. The MEMS AE transducer system of claim 11, wherein a largest dimension of the chip is smaller than a smallest wavelength corresponding to the first and second frequency ranges.

13. A microelectromechanical systems (MEMS) acoustic emissions (AE) transducer system comprising:
   an array of N MEMS AE transducers integrated together in a chip, where N is a positive integer that is greater than two, at least first and second MEMS AE transducers of the array operating over at least first and second frequency ranges, respectively, that are separate from one another, the first and second MEMS AE transducers generating first and second electrical responses in response to receiving acoustic emissions in the first and second frequency ranges, respectively, the first and second electrical responses being continuously electrically combined to generate a combined electrical response and output from the chip on a single channel of the chip.

14. The MEMS AE transducer system of claim 13, wherein at least the first and second MEMS AE transducers are electrically coupled together in series to generate the combined electrical response prior to being output from the chip on the single electrical channel.

15. The MEMS AE transducer system of claim 14, wherein each MEMS AE transducer comprises:
   one or more electrically-conductive semiconductor layers comprising a first electrode;
   one or more metal layers comprising a second electrode; and
   one or more piezoelectric layers disposed in between and in contact with the first electrode and the second electrode.

16. The MEMS AE transducer system of claim 15, wherein said one or more electrically-conductive semiconductor layers comprise one or more layers of N-doped silicon and wherein said one or more piezoelectric layers comprise one or more layers of aluminum nitride.

17. The MEMS AE transducer system of claim 15, wherein at least one of the first and second MEMS AE transducers has a four-beam design, each beam being formed in said one or more electrically-conductive semiconductor layers, each beam having a first end that is coupled to a central disk-shaped portion of said one or more electrically-conductive semiconductor layers and a second end that extends away from the first end and is coupled to an outer portion of said one or more electrically-conductive semiconductor layers.

18. The MEMS AE transducer system of claim 17, wherein at least one of the first and second MEMS AE transducers has a diaphragm design, a diaphragm portion of said one or more electrically-conductive semiconductor layers comprising the first electrode of the at least one MEMS AE transducer, said one or more piezoelectric layers of piezoelectric material being disposed on top of the diaphragm portion, said one or more metal layers being disposed on top of said one or more piezoelectric layers of piezoelectric material to form a top electrode of the at least one MEMS AE transducer on top of the diaphragm portion, said one or more piezoelectric layers of piezoelectric material being clamped about its circumference by the diaphragm portion of said one or more electrically-conductive semiconductor layers.

19. The MEMS AE transducer system of claim 15, wherein the first MEMS AE transducer has a four-beam design and the second MEMS AE transducer has a diaphragm design, each beam of the first MEMS AE transducer being formed in said one or more electrically-conductive semiconductor layers, each beam having a first end that is coupled to a central disk-shaped portion of said one or more electrically-conductive semiconductor layers of the first MEMS AE transducer and a second end that extends away from the first end and is coupled to an outer portion of said one or more electrically-conductive semiconductor layers of the first MEMS AE transducer, wherein a diaphragm portion of the second MEMS AE transducer is formed in said one or more electrically-conductive semiconductor layers and comprises the first electrode of the second MEMS AE transducer, said one or more piezoelectric layers of piezoelectric material of the second MEMS AE transducer being disposed on top of the diaphragm portion, said one or more metal layers of the second MEMS AE transducer being disposed on top of said one or more piezoelectric layers of piezoelectric material of the second MEMS AE transducer to form a top electrode of the second MEMS AE transducer on top of the diaphragm portion, said one or more piezoelectric layers of piezoelectric material of the second MEMS AE transducer being clamped about a circumference of the said one or more piezoelectric layers of piezoelectric material by said one or more electrically-conductive semiconductor layers.

20. A method for performing non-destructive evaluation (NDE) of structural health of a structure:
   coupling an NDE chip package to the structure, the chip package comprising a chip having a microelectromechanical systems (MEMS) acoustic emissions (AE) transducer system comprising at least first and second MEMS AE transducers integrated together in the chip, the first and second MEMS AE transducers operating over at least first and second frequency ranges, respectively, that are separate from one another, the first and second MEMS AE transducers generating first and second electrical responses in response to receiving acoustic emissions in the first and second frequency ranges, respectively, the first and second electrical responses being continuously electrically combined to generate a combined electrical response and output from the chip package on a single channel of the chip package;
   with a data acquisition system in communication with the chip package, receiving the combined electrical response output on the single channel and performing a signal processing algorithm that processes the combined electrical response to extract the first and second electrical responses from the combined electrical response; and
   evaluating the first and second electrical responses to determine the structural health of the structure.

* * * * *